United States Patent
Kato et al.

(10) Patent No.: US 6,480,437 B2
(45) Date of Patent: Nov. 12, 2002

(54) SEMICONDUCTOR MEMORY DEVICE PERMITTING IMPROVED INTEGRATION DENSITY AND REDUCED ACCESSING TIME

(75) Inventors: Hiroshi Kato, Hyogo (JP); Tsukasa Ooishi, Hyogo (JP); Hideto Hidaka, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/986,584

(22) Filed: Nov. 9, 2001

(65) Prior Publication Data

US 2002/0027818 A1 Mar. 7, 2002

Related U.S. Application Data

(62) Division of application No. 09/311,560, filed on May 14, 1999, now Pat. No. 6,333,884.

(30) Foreign Application Priority Data

Jul. 22, 1998 (JP) .......................................... 10-206821
Dec. 9, 1998 (JP) .......................................... 10-350351

(51) Int. Cl.$^7$ ............................................... G11C 8/00
(52) U.S. Cl. .............................. 365/230.03; 365/230.06
(58) Field of Search ....................... 365/230.03, 230.06, 365/230.01

(56) References Cited

U.S. PATENT DOCUMENTS

| | | | |
|---|---|---|---|
| 5,274,595 A | 12/1993 | Seok et al. | 365/203 |
| 5,283,760 A | 2/1994 | Chin et al. | 365/189.01 |
| 5,341,331 A | 8/1994 | Jeon | 365/189.01 |

FOREIGN PATENT DOCUMENTS

| | | |
|---|---|---|
| JP | 63-183687 | 7/1988 |
| JP | 4-209394 | 7/1992 |
| JP | 4-319596 | 11/1992 |
| JP | 5-74143 | 3/1993 |
| JP | 6-302187 | 10/1994 |

OTHER PUBLICATIONS

"Ultra LSI Memory", Kiyoo ITO, Advanced Electronics Series, I–9, Baifukan, Nov. 5, 1994, pp. 165–167 & pp. 333–341 (with English commentary).

*Primary Examiner*—Hoai Ho
(74) *Attorney, Agent, or Firm*—McDermott, Will & Emery

(57) ABSTRACT

A sub-amplifier includes first and second transistors which each receive the potential of a sub-I/O line pair at each gate, a third transistor controlled by a signal transmitted in the memory cell column-direction and coupling the sources of the first and second transistors and a ground potential, and fourth and fifth transistors controlled by a signal transmitted in the memory cell row-direction and coupling the drains of the first and second transistors and a main I/O line pair. Since the sub-amplifier is controlled by a signal transmitted in the column-direction, the influence of skew with a column selecting signal can be reduced.

5 Claims, 26 Drawing Sheets

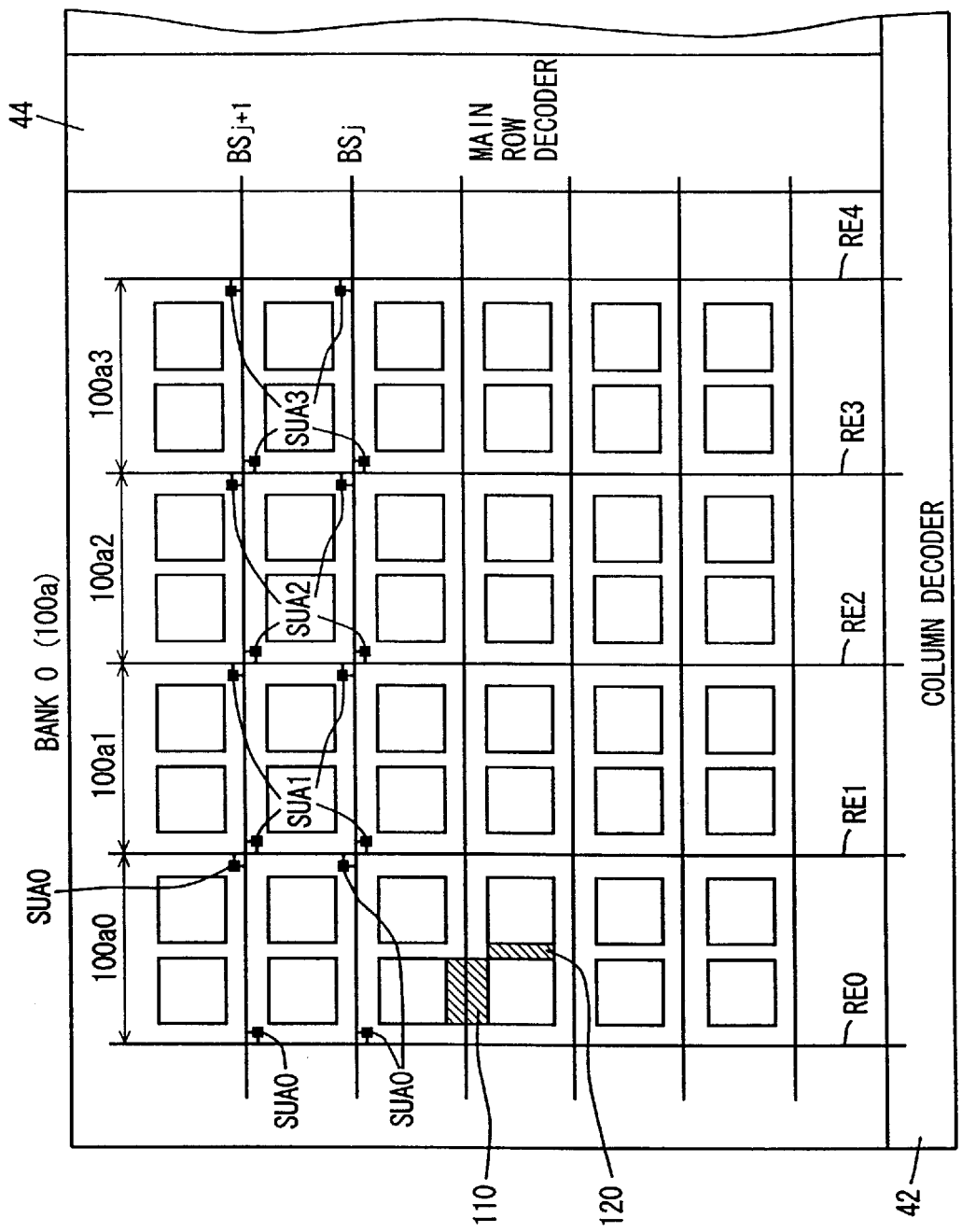

SEMICONDUCTOR MEMORY DEVICE PERMITTING IMPROVED INTEGRATION DENSITY AND REDUCED ACCESSING TIME

This application is a divisional of application Ser. No. 09/311,560 filed May 14. 1999, now U.S. Pat. No. 6,333,884.

BACKGROUND OF THE INVENTION

1. Field of the Invention

The present invention relates generally to semiconductor memory devices, and more particularly, to reading-related circuitry in a semiconductor memory device.

2. Description of the Background Art

In recent years, as the storage capacity of semiconductor integrated circuit devices has increased, the critical dimension (the minimum manufacturable size) of transistors which form memory cells in the devices has been reduced as well. This gives rise to the necessity of miniaturizing transistors which form peripheral circuits and interconnections as well as the necessity of miniaturizing those which form memory cells.

The miniaturization of transistors to form sense amplifiers used for sensing slight potential difference generated between a bit line pair at the time of reading out data from a memory cell means a decline in the current driving capability per transistor. Thus, time required for the sense amplifier circuit to driving input/output (hereinafter "I/O") line pairs in the array to indirect peripheral circuits such as an I/O line pair to a main amplifier increases.

A so-called direct-sense scheme is known as a method for solving such a disadvantage. An example of the direct-sense scheme is shown in FIG. 30.

The gates of transistors 902 and 904 receive the potential levels of data line pairs DL1 and /DL1, respectively, the potential difference of which is amplified by a sense amplifier 900 according to the storage information of a selected memory cell.

The sources of transistors 902 and 904 are supplied with a ground potential through a transistor 906 having its gate potential controlled by read control signal iore.

Transistor 902 has its drain connected to a data line DL2 through a transistor 908 having its gate potential controlled by a reading control signal iore. Meanwhile, transistor 904 has its drain connected to a data line /DL2 through a transistor 910 having its gate potential controlled by reading control signal iore.

Data read out from a memory cell is transmitted to an indirect peripheral circuit 920 by data line pair DL2, /DL2.

Hereinafter, the circuit formed by transistors 902 to 910 will be called "a sub-amplifier".

In such direct sense scheme, data line pair DL1, /DL1 and data line pair DL2, /DL2 are isolated by transistors 902 and 904. As a result, the capacity driven by sense amplifier 900 is simply that of data line pair DL1, /DL1 to transistors 902 and 904, while data line pair DL2, /DL2 are driven by the sub-amplifier.

More specifically, the capacity driven by sense amplifier 900 is restrained, which allows for accessing at a higher speed.

However, in order to further increase the accessing speed, the following problem will be encountered.

In the conventional configuration shown in FIG. 30, a sense amplifier itself is often provided at the position of the sub-amplifier described above.

Alternatively, such a sub-amplifier is often located at a crossing point of a sense amplifier band and a sub-word driver band (hereinafter referred to as "a cross point").

FIG. 31 is a schematic block diagram of an example of such a configuration.

Referring to FIG. 31, there are provided a main row decoder 940 and a column decoder 950 corresponding to a memory mat 930.

Memory mat 930 is divided into sub-blocks 936 by sense amplifier bands 932 and word driver regions 934.

In this configuration, sub-amplifiers SUA are provided at cross points of local I/O line pairs in the row-direction and global I/O line pairs in the column direction.

Signal iore to control sub-amplifier SUA is generated by main row decoder 940 and transmitted in the row-direction to sub-amplifier SUA.

However, the data reading operation itself is the operation by the column-related circuitry, and therefore, a signal line to transmit signal iore provided in the row-direction and a column selecting line YS to transmit a column selecting signal are perpendicular to each other. When column selecting line YS and the path to transmit signal iore are provided perpendicular to each other, a timing margin should be secured between the signals in view of skew between the signals, which impairs the accessing time from being reduced.

The miniaturization of a transistor forming sub-amplifier SUA increases sub-threshold leakage current by the transistor, and the power consumption disadvantageously increases by a constant amount of leakage current generated, even if the circuit is in a stand-by state, in other words, if transistor 906 is in a disconnected state.

SUMMARY OF THE INVENTION

It is an object of the present invention to provide a semiconductor memory device which permits accessing time to be improved in a large scale integrated semiconductor memory device.

Another object of the present invention is to provide a synchronous semiconductor memory device which permits the power consumption in a stand-by state to be reduced.

Briefly stated, a semiconductor memory device according to the present invention includes a memory cell array, a row selecting circuit, a column selecting circuit, a plurality of sense amplifiers, a plurality of sub-I/O line pairs, a selecting gate circuit, a main I/O line pair, and a plurality of sub-amplifiers.

The memory cell array includes a plurality of memory cells arranged in a matrix of rows and columns. The memory cell array includes a plurality of memory cell blocks. The row selecting circuit selects a corresponding memory cell row in response to an address signal. The column selecting circuit selects a corresponding memory cell column in response to an address signal.

The plurality of sense amplifiers are provided corresponding to memory cell columns in each memory cell block to amplify data from a selected memory cell.

The plurality of sub-I/O line pairs are provided corresponding to the plurality of memory cell blocks. The selecting gate circuit transmits reading data from a sense amplifier corresponding to a selected memory cell column in response to a column selecting signal transmitted in the memory cell column direction from the column selecting circuit. The main I/O line pair is provided in common to the plurality of memory cell blocks.

The plurality of sub-amplifiers transmit reading data transmitted from a sub-I/O line pair to the main I/O line pair. Each sub-amplifier includes first and second MOS transistors which each receive the potential of a sub-I/O line for a corresponding gate and discharge the corresponding main I/O line pair from a second potential to a first potential, an activation circuit which responds to a row-related control signal transmitted in the row direction of the memory cells and a column-related control signal transmitted in the column direction of the memory cells to activate the first and second transistors to perform discharging operation.

A semiconductor memory device according to another aspect of the present invention includes a memory cell array, a plurality of sense amplifiers, a plurality of I/O line pairs, a plurality of precharge circuits, a plurality of sub-amplifiers, and a segment signal line.

The memory cell array includes a plurality of memory cells arranged in a matrix of rows and columns. The memory cell array is divided into a plurality of memory cell blocks arranged in a matrix of rows and columns.

The plurality of sense amplifiers are provided corresponding to memory cell columns in each memory cell block to amplify data from a selected memory cell as complementary signals.

Each of the I/O line pairs is provided in common to at least two of memory cell blocks. The precharge circuits precharge I/O line pairs to a first potential. The plurality of sub-amplifiers are provided corresponding to the sense amplifiers to transmit read data to the I/O line pairs. Each of the sub-amplifiers includes first and second MOS transistors which have gates to receive complementary signals from a sense amplifier corresponding to said selected memory cell and discharge a corresponding one line of I/O line pair from the first potential to a second potential.

The segment signal lines supply the second potential to the first and second transistors.

A semiconductor memory device according to another aspect of the present invention includes a first plurality of banks, a row selecting circuit, a column selecting circuit, a plurality of first column selecting lines, a plurality of first I/O line pairs, and a first selecting circuit.

The first plurality of banks are arranged in the column-direction. The banks each include a second plurality of memory cell blocks arranged in the row-direction. The memory cell blocks each include a plurality of memory cells arranged in a matrix of rows and columns and bit line pairs provided corresponding to memory cell columns.

The row selecting circuit responds to an address signal to select a corresponding bank and a corresponding memory cell row. The column selecting circuit generates a column selecting signal to select a memory cell corresponding column in response to an address signal.

The plurality of the first column selecting lines are provided in common to the first plurality of banks in the column direction and transmit a column selecting signal.

The plurality of first I/O line pairs are provided corresponding to the first plurality of banks in the row-direction. The first selecting circuit transmits reading data from a memory cell column selected in response to a column selecting signal to the first I/O line pair.

The first selecting circuits are provided corresponding to memory cell columns in a memory cell block and include a plurality of first gate circuits controlled by a corresponding first column selecting line of the first column selecting lines. Each of the first gate circuits includes a first transfer gate circuit provided on a transmission path between a bit line pair for a corresponding memory cell column and one of the first I/O line pairs and controlled by a corresponding first column selecting line to attain a conductive state or a disconnected state, and a direct sense type gate circuit provided in series with the first transfer gate circuit on the transmission path.

A semiconductor memory device according to yet another aspect of the present invention includes a first plurality of banks, a row selecting circuit, a plurality of bank selecting lines, a column selecting circuit, a plurality of column selecting lines, a plurality of I/O line pairs, and a plurality of selecting circuits.

The first plurality of banks are provided in the column-direction. Each of the banks includes a second plurality of memory cell blocks provided in the row-direction. Each of the memory cell blocks includes a plurality of memory cells arranged in a matrix of rows and columns and bit line pairs provided corresponding to memory cell columns.

The row selecting circuit responds to an address signal to generate a bank selecting signal for selecting a corresponding bank and selects a corresponding memory cell row. The plurality of bank selecting lines are provided in the row-direction for each of the banks to transmit a bank selecting signal. The column selecting circuit responds to an address signal to generate a column selecting signal for selecting a corresponding memory cell column. The plurality of column selecting lines are provided in common to the first plurality of banks in the column-direction to transmit a column selecting signal. The plurality of I/O line pairs are provided in the row-direction corresponding to the first plurality of banks.

The selecting circuits transmit read data from a selected memory cell column in response to a column selecting signal. The selecting circuits each include a plurality of gate circuits provided corresponding to the memory blocks and controlled by a corresponding column selecting line. The gate circuits each include a product signal generating circuit which responds to an activation of a corresponding column selecting line and an activation of a corresponding bank selecting line to generate an active driving signal, and a transfer gate circuit provided on the transmission path between a bit line pair for a corresponding memory cell column and one of the I/O line pairs and controlled by a driving signal to attain a conductive state or a disconnected state.

Therefore, a main advantage of the present invention resides in that the timing between signals can be readily controlled for small skew between the signals in connection with the control of a sub-amplifier and the control for column selection, which allows for high speed accessing.

Another advantage of the present invention resides in that only a memory cell block to which a selected memory cell belongs can be selectively operated, and therefore the power consumption and noise can be reduced.

Yet another advantage of the present invention resides in that high speed operation can be implemented while restraining increase in the layout area in a horizontally divided bank arrangement.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram for illustrating the concept of how a read enable signal REi and block selecting signal BSj are transmitted to a sub-amplifier SUA;

DESCRIPTION OF THE PREFERRED EMBODIMENTS

First Embodiment

Figure 1:
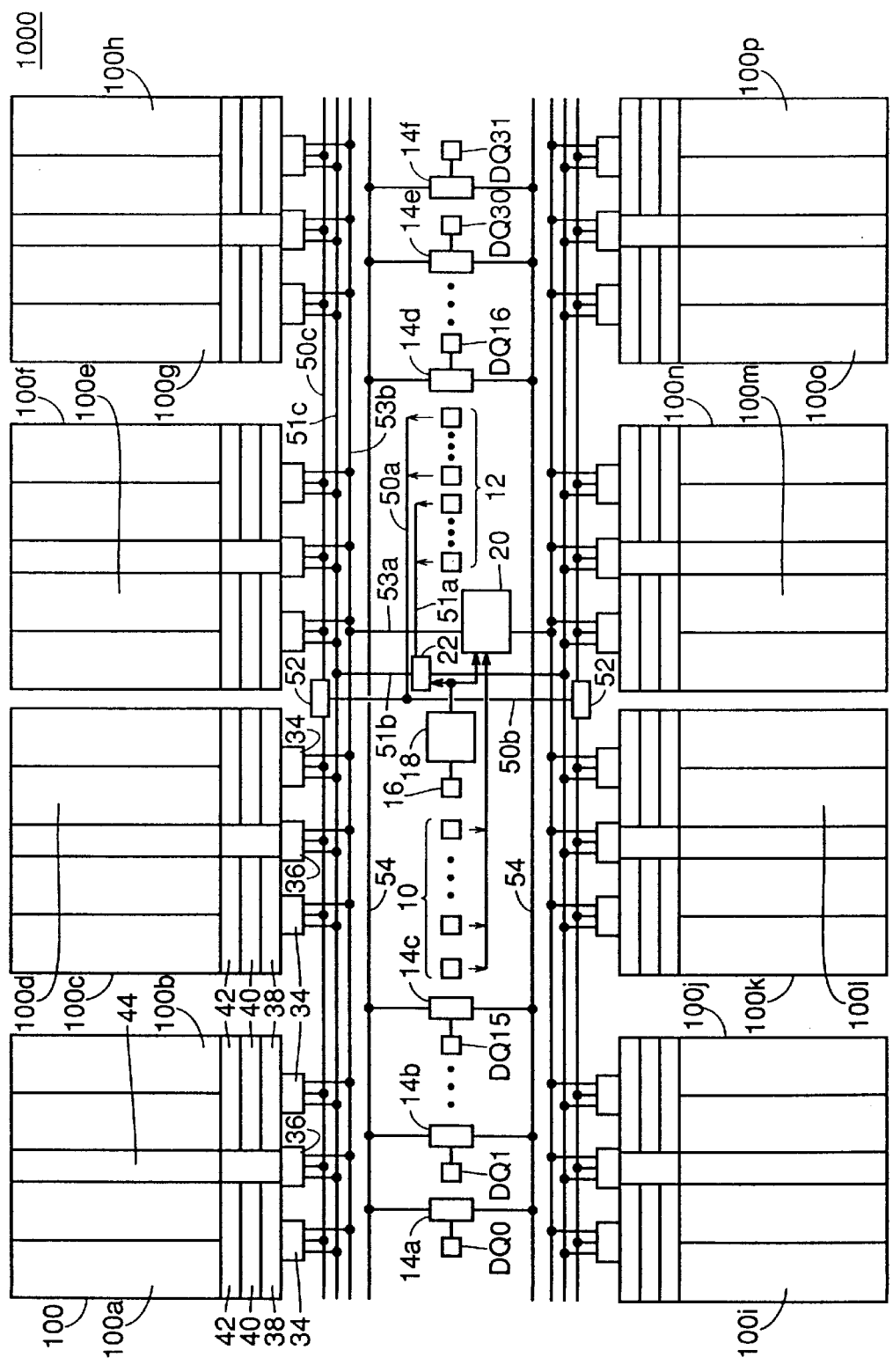
FIG. 1 is a schematic block diagram of a synchronous semiconductor memory device 1000 according to a first embodiment of the present invention.

FIG. 1 is a schematic block diagram of a synchronous semiconductor memory device 1000 according to a first embodiment of the present invention.

Referring to FIG. 1, synchronous semiconductor memory device 1000 includes a mode decoder 20 which receives externally applied control signals /RAS, /CAS, /W and /CS and decodes these signals to generate internal control signals, command data buses 53a and 53b which transmit the internal control signals output from mode decoder 20 and a memory cell array 100 having memory cells arranged in a matrix of rows and columns.

Memory cell array 100 is divided into in total 16 memory cell blocks 100a to 100b as shown in FIG. 1. If synchronous semiconductor memory device 1000 has a storage capacity of 1 G bits, for example, each of the memory cell blocks has a capacity of 64 M bits. Each of the blocks can operate independently as a bank.

Synchronous semiconductor memory device 1000 further includes an internal clock generating circuit 18 which receives complementary external dock signals ext. CLK and /ext. CLK applied at clock signal input terminals 16a and 16b (generically represented by 16 in FIG. 1), starts a synchronizing operation under the control of mode decoder 20, and outputs internal clock signal int. CLK.

External address signals A0 to Ai (i: natural number) applied through an address signal input terminal group 12 are received into synchronous semiconductor memory device 1000 in synchronization with internal clock signal int. CLK. under the control of mode decoder 20.

Among external address signals A0 to Ai, data of a prescribed number of bits is provided to a bank decoder 22 through an address bus 51a. Decoded bank addresses B0 to B7 are transmitted from bank decoder 22 to each of the banks through address buses 51b and 51c.

Meanwhile, other external address signals applied to address signal input terminal group 12 are transmitted to an address driver 52 through address buses 50a and 50b. The address signals are further transmitted to each of the banks (memory cell blocks) through an address bus 50c.

Synchronous semiconductor memory device 1000 further includes a pre-decoder 36 provided for each pair of memory cell blocks to latch and pre-decode a row address transmitted by address bus 50c under the control of mode decoder 20, a row decoder 44 which selects a row (word line) to which a memory cell block selected based on an output from row pre-decoder 36, a column pre-decoder 34 which latches and pre-decodes a column address transmitted by address bus 50c under the control of mode decoder 20, a pre-decoder line 40 which transmits an output from pre-decoder 34, and a column decoder 42 which selects a column (bit line pair) to which a memory cell block selected based on an output from column pre-decoder line 40.

Synchronous semiconductor memory device 1000 further includes data I/O terminals DQ0 to DQ15 and DQ16 to DQ31 provided in the region along the longer-side direction of the central part of the chip and outside the regions of external control signal input terminal group 10 and address signal input terminal group 12, respectively, I/O buffer circuits 14a to 14f provided corresponding to data I/O terminals DQ0 to DQ31, a data bus 54 which transmits data between the I/O buffer circuit and a corresponding memory cell block, and read/write amplifiers 38 provided corresponding to memory cell blocks 100a to 100p to exchange data between data bus 54 and a memory cell column.

I/O buffer circuits 14a to 14f, though not shown in FIG. 1, exchange data with a memory cell array 100 through a data I/O circuit 1086 which performs serial/parallel conversion of externally applied writing data and parallel/serial conversion of internal reading data.

Signals /CS, /RAS, /CAS and /W are received in synchronization with internal clock signal int. CLK.

An address signal applied to address signal input terminal group 12 is also received in synchronization with the internal clock signal.

Note that although the present invention is applied to a synchronous semiconductor memory device in the following for ease of illustration, the invention is not limited to the synchronous semiconductor memory device and is more generally applicable to data reading-related circuitry in a semiconductor memory device.

I/O Line Pair for Reading Out Data

Figure 2:
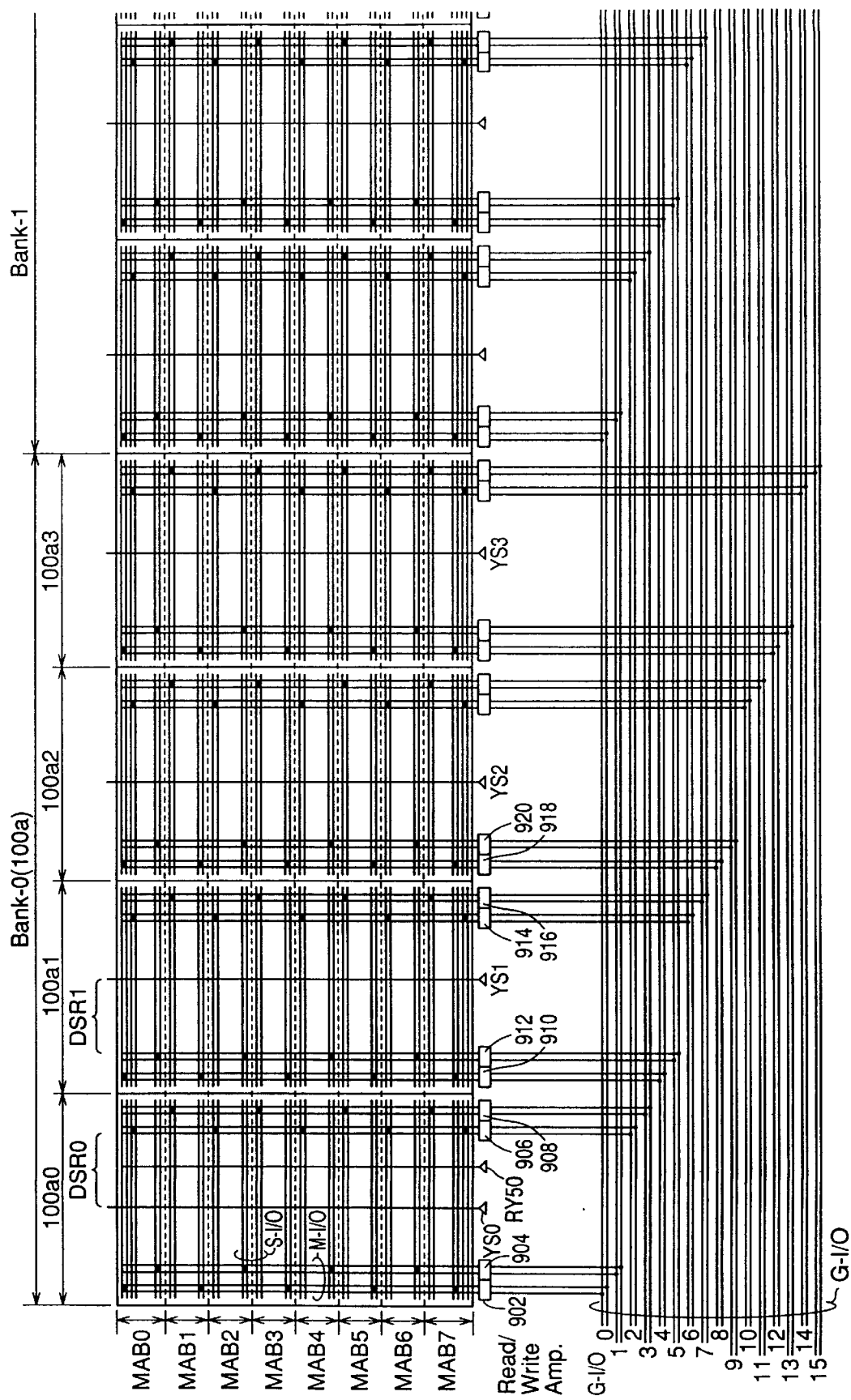
FIG. 2 is a block diagram of the arrangement of a global I/O data bus G-I/O, a sub-I/O line pair S-I/O and a main I/O line pair M-I/O.

FIG. 2 is a block diagram of an example of the arrangement of a sub-I/O line Pair S-I/O and a main I/O line pair M-I/O which transmit data read out from a memory array bank shown in FIG. 1 to a global I/O data bus G-I/O.

In FIG. 2, bank 0 (which corresponds to memory cell array block 100a in FIG. 1) is divided into four regions 100a0 to 100a3.

Bank 0 (Bank-0) corresponds to one (64-bit region) of 16 parts produced by dividing memory cell array 100 shown in FIG. 1. Herein, one of banks 100a, 100b, 100c, 100d, 100i, 100j, 100k and 100l belonging to the left half of the configuration shown in FIG. 1 is activated and data is output from corresponding data I/O terminals DQ0 to DQ15 in a reading operation. Meanwhile, one of banks 100e, 100f, 100g, 100h, 100m, 100n, 100o and 100p belonging to the right half of FIG. 1 is activated and data is output from corresponding data I/O terminals DQ16 to DQ31.

As shown in FIG. 2, each of regions 100a0 to 100a3 is divided into 8 memory cell array mats MAB0 to MAB7 in the column-direction. A sense amplifier band (not shown) is present corresponding to the region of each of memory cell array mats MAB0 to MAB7 and amplifies data from a selected memory cell.

The configuration of region 100a0 will be now described by way of illustration.

For each mat, a sub-I/O line pair S-I/O runs in the word line-direction (in the direction along G-I/O in FIG. 2). A column line YS selected according to an external address signal is activated and connected to a sense amplifier in a corresponding memory cell column, so that reading data amplified by the sense amplifier is transmitted onto sub-I/O line pair S-I/O. Sub-I/O line pair S-I/O has a complementary arrangement to transmit a single piece of data.

A main I/O line pair M-I/O runs in the lengthwise direction of each of the memory cell array mats (in the direction perpendicular to G-I/O in FIG. 2 and in the column-direction of the memory cell array). Data transmitted from a sub-I/O line pair is amplified by a sub-amplifier SUA located at a cross point of this sub-I/O line pair S-I/O and main I/O line pair M-I/O, and then transmitted to a corresponding main I/O line pair M-I/O. Reading data transmitted from main I/O line pair M-I/O is amplified by read/write amplifiers 902, 904, 906 and 908 and transmitted to a corresponding global I/O bus G-I/O.

A main I/O line pair has a complementary arrangement to transmit a single piece of data.

In FIG. 2, at the regions represented by solid squares at cross points of sub-I/O line pairs and main M-I/O line pairs, transfer gates and sub-amplifiers to connect the sub-I/O line pairs S-I/O and main I/O line pairs M-I/O are located.

In a writing operation, external data is written into a memory cell through the path opposite to the above described path.

The number of memory cells selected by activating a single column selecting line is for example 4.

Figure 3:
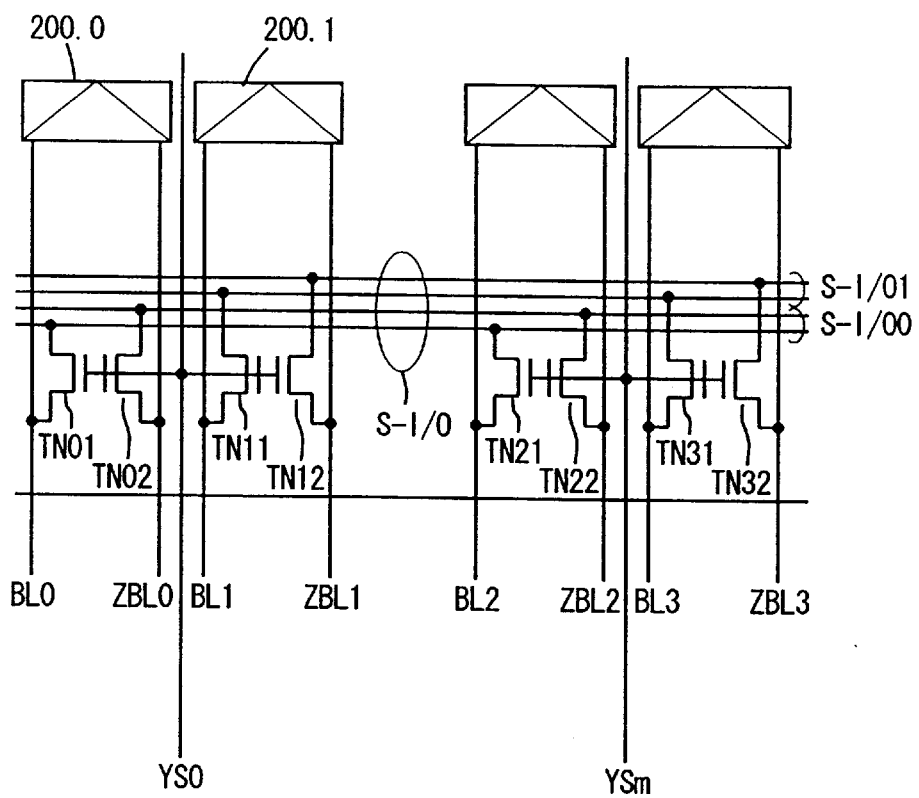
FIG. 3 is a circuit diagram of a transfer gate portion to transmit data to a sub-I/O line pair RS-I/O.

In this case, as shown in FIG. 2, column selecting line YS0 is activated in region 100a0, column selecting line YS1 in region 100a1, column selecting line YS2 in region 100a2 and column selecting line YS3 in region 100a3 while 16 pieces of data are read out simultaneous FIG. 3 is a circuit diagram of a transfer gate portion to transmit data to sub-I/O line pair S-I/O from a selected bit line pair for example in region 100a0.

In FIG. 3, a part of the configuration in which two corresponding memory cell columns are connected to two sub-I/O line pairs S-I/O by the single column selecting line YS0.

Referring to FIG. 3, when column selecting line YS0 is activated, a pair of bit lines BL0, ZBL0 are connected to sub-I/O line pair S-I/O0 through transfer gates TN01 and TN02, respectively. Thus, reading data amplified by sense amplifier 200.0 is transmitted to sub-I/O line pair S-I/O0.

Meanwhile, when column selecting line YS0 is activated, a pair of bit lines BL1 and ZBL1 are connected to sub-I/O line pair S-I/O1 through transfer gates TN11 and TN12, respectively. Thus, reading data amplified by sense amplifier 200.1 is transmitted to sub-I/O line pair S-I/O1.

Figure 4:
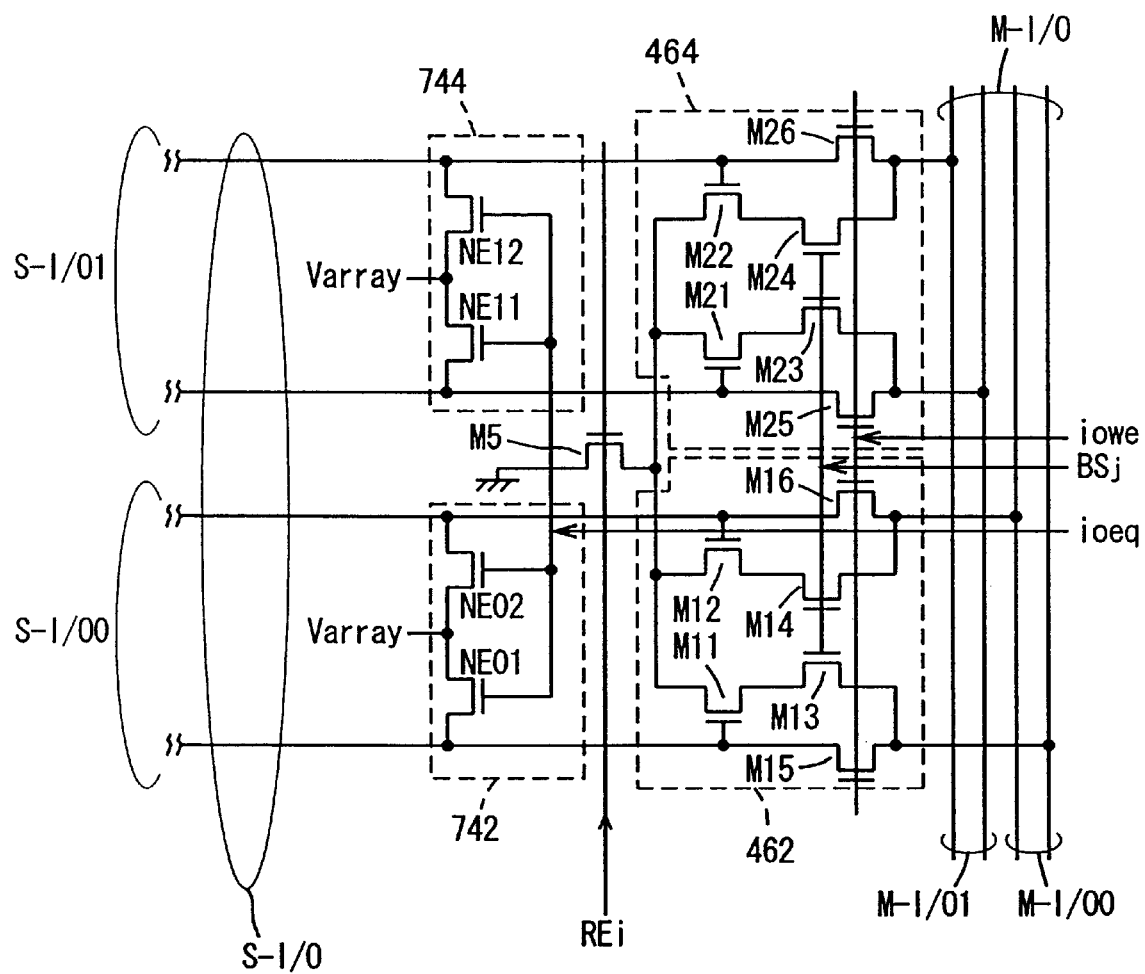
FIG. 4 is a circuit diagram of equalize circuits 742 and 744 and sub-amplifiers 462 and 464.

FIG. 4 is a circuit diagram of equalize circuits 742 and 744 and sub-amplifiers 462 and 464 provided at cross points of sub-I/O line pairs S-I/O0 and S-I/O1 and corresponding main I/O line pairs M-I/O0 and M-I/O1.

Equalize circuit 742 and sub-amplifier 462 are provided corresponding sub-I/O line pair S-I/O0, and equalize circuit 744 and sub-amplifier 464 are provided corresponding sub-I/O line pair S-I/O1. Equalize circuit 742 includes N-channel MOS transistors NE01 and NE02 connected in series between sub-I/O line pair S-I/O0 and turned on by a signal ioeq. A precharge potential Varray is supplied to the connection point of transistors NE01 and NE02.

Herein, precharge potential Varray is a potential lowered from an external power supply potential for supply to the memory cell array.

Sub-amplifier 462 includes N-channel transistors M11 and M12 having their sources connected to the drain of an N-channel MOS transistor M5 which receives read enable signal REi (i:natural number) at its gate and a ground potential at its source and their gates connected to corresponding I/O lines of sub-I/O line pair, and N channel MOS transistors 13 and 14 connected between the drains of transistors M11 and M12 and corresponding I/O lines of main I/O line pair M-I/O0 and having their gate potentials controlled by a block selecting signal BSj (j: natural number).

As will be described, the read enable signal is transmitted by a signal line extending from the column decoder side in the column-direction, while block selecting signal BSj is transmitted by a signal line extending from the main decoder side in the row-direction.

Block selecting signal BSj is a signal to instruct which one of memory cell array mats MAB0 to MAB7 shown in FIG. 2 is selected.

More specifically, when transistors M13 and M14 are turned on in response to an activation of signal BSj, transistor M5 is turned on in response to an activation of signal REi, and when the source potential levels of transistors Ml and M12 are pulled down to the ground potential level, one of the potential levels of main I/O line pair M-I/O0 is pulled down to the ground potential based on the potential level of sub-I/O line pair S-I/O0.

As described above, data transmitted by sub-I/O line pair in the reading operation is transmitted to main I/O line pair.

Furthermore, sub-amplifier 462 includes transistors M15 and M16 connected between sub-I/O line pair S-I/O0 and main I/O line pair M-I/O0, respectively and have their gate potentials controlled by a signal iowe.

More specifically, in a writing operation, when signal iowe is activated, transistors M15 and M16 are both turned on, and sub-I/O line pair S-I/O0 and main I/O line pair M-I/O0 are directly connected.

The same configuration is provided for sub-I/O line pair S-I/O1 and main I/O line pair M-I/O1.

Thus, two signals, signal BSj transmitted in the row-direction and signal REi transmitted in the column-direction activate sub-amplifier 462.

Figure 31:
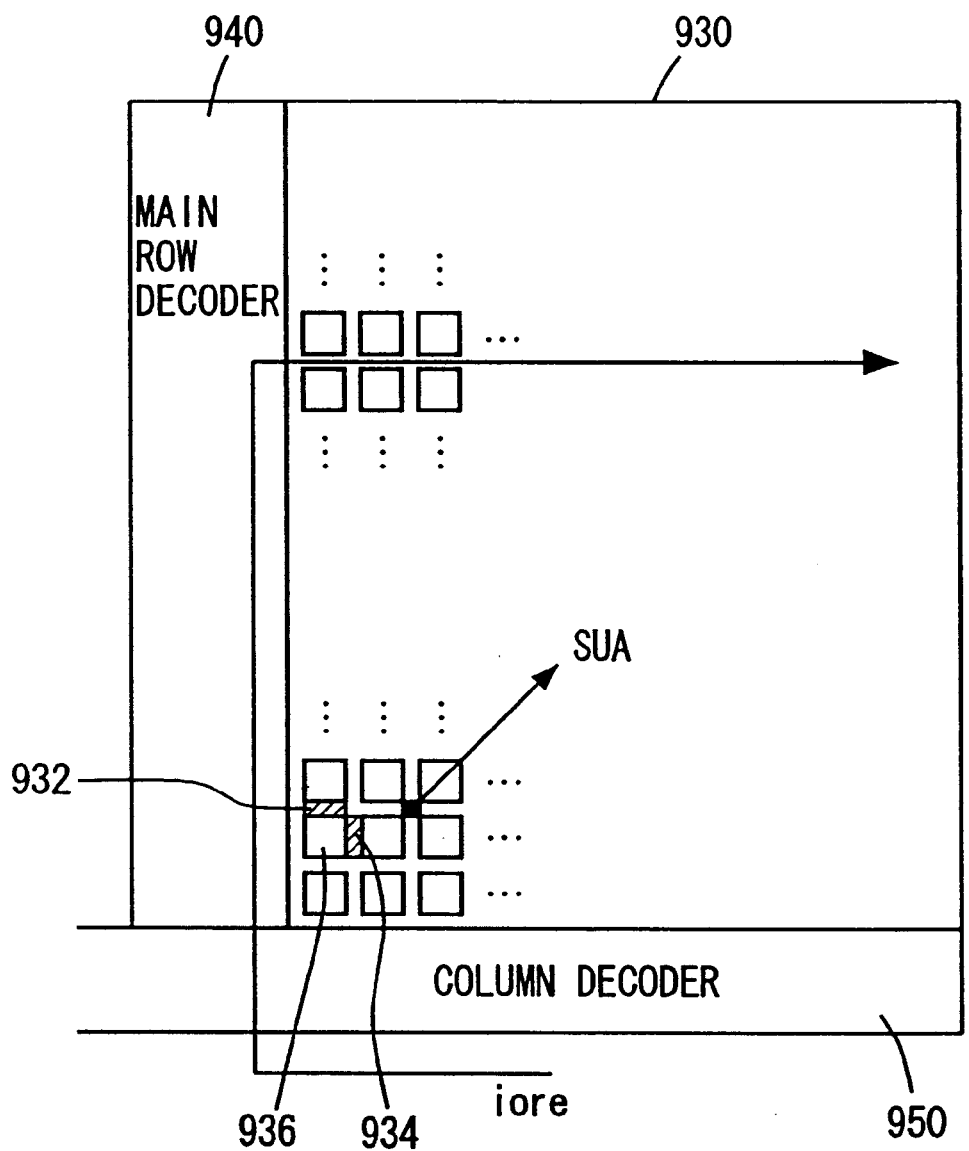
FIG. 31 is a schematic block diagram of a conventional sub-amplifier arrangement.

More specifically, signal BSj transmitted in the row-direction for example is activated simultaneously with an activation of a word line. Meanwhile, sub-amplifiers 462 and 464 are activated by read enable signal REi transmitted on a signal line parallel with the column selecting lines in the succeeding column accessing. In the conventional configuration shown in FIG. 31, sub-amplifier SUA is activated by signal iore transmitted through main row decoder 940, while in FIG. 4, sub-amplifiers 462 and 464 can be controlled by signal REi transmitted in parallel with the column selecting lines, and therefore the timing control between signals can be readily made for small skew between column selecting lines and signals, which permits even higher speed accessing to be implemented.

FIG. 5 is a diagram illustrating how read enable signal REi and block selecting signal BSj are transmitted to sub-amplifier SUA.

Hereinafter, bank 0, in other words, region 100a in FIG. 1 will be described by way of illustration.

A memory cell array included in region 100a is divided into memory cell array mats MAB0 to MAB7 by sense amplifier bands 110 in the column-direction and each of the memory cell array mats is divided into two regions by sub word decoders 120 in the row-direction.

Two signals, signal BSj and BSj+1 transmitted from main row decoder 44 are used to select a single memory cell array mat.

In the configuration shown in FIG. 5, data is simultaneously read out from all the regions 100a0 to 100a3. More specifically, signals RE0 to RE4 are all activated simultaneously.

Therefore, by the activation of signals BSj, BSj+1 and signals RE0 to RE4, sub-amplifier SUA0 provided corresponding to region 100a0 and sub-amplifier SUA1 corresponding to region 100a1, sub-amplifier 100a2 corresponding region 100a2 and sub-amplifier SUA3 corresponding region 100a3 are simultaneously activated, and data is read out from main I/O line pair M-I/O corresponding to all the regions 100a0 to 100a3 in bank 0 by a single column accessing operation.

Figure 6:
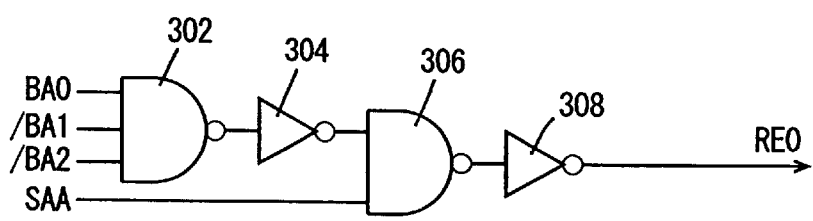
FIG. 6 is a schematic block diagram of a read enable signal generating circuit 300 which generates read enable signals RE0 to RE4.

FIG. 6 is a schematic block diagram of read enable signal generating circuit 300 which generates read enable signals RE0 to RE4 shown in FIG. 5.

In FIG. 6, read enable signal RE0 is generated by way of illustration.

Read enable signal generating circuit 300 includes a 3-input NAND circuit 302 which receives a bank selecting signal BA0 at its first input node, and the inverse /BA1 of bank selecting signal BA1 and the inverse /BA2 of bank selecting signal BA2 at its second and first input nodes, respectively, an inverter 304 which receives the output of NAND circuit 302, a 2-input NAND circuit 306 which receives the output of inverter 304 and a sub-amplifier activation signal SAA, and an inverter 308 which receives the output of NAND circuit 306 and outputs read enable signal RE0.

The read enable signal generating circuits which generate read enable signals RE1 to RE4 have the same configuration.

The read enable signal generating circuits in the other banks basically have the same configuration except that NAND circuits 302 receive bank signals of different combinations.

Figure 7:
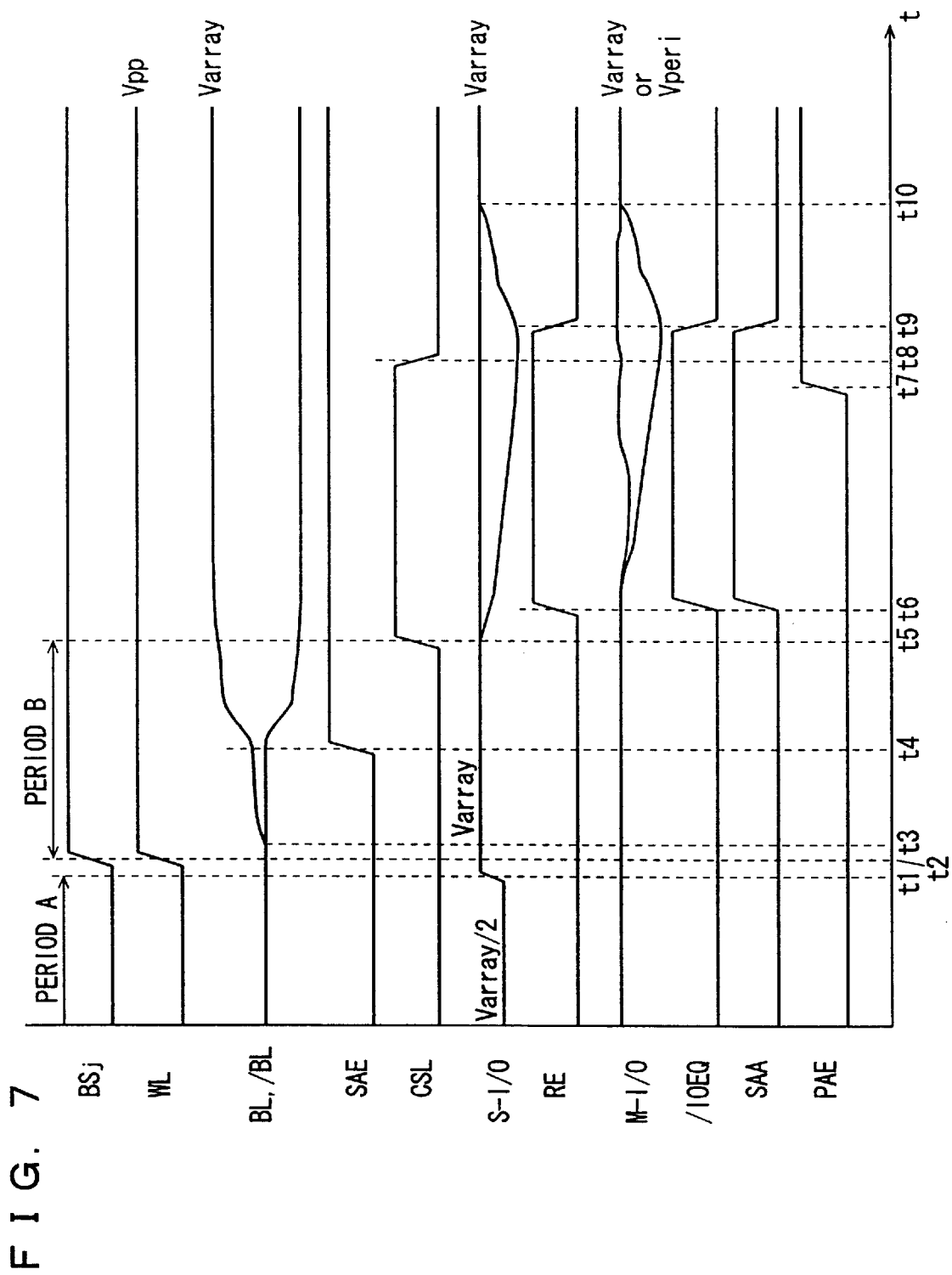
FIG. 7 is a timing chart for use in illustration of the potential of a reading-related circuit.

FIG. 7 is a timing chart for use in illustration of the operation of the reading-related circuits described in conjunction with FIGS. 2 to 6.

In FIG. 7, the portions whose potential level are not clearly shown are ground potential at an "L" level or power supply potential Vcc at "H" level.

At time t1, in a stand-by state, the potential of sub-I/O line pair S-I/O equalized to the potential Varray/2 is precharged to potential Varray.

Subsequently, at time t2, the potential levels of block selecting signal BSj corresponding to a selected memory mat and a selected word line are activated. At time t3, the potential level of a bit line pair changes according to storage data in a memory cell connected to the selected word line accordingly.

At time t4, sense amplifier activation signal SAE is activated and the potential difference generated between the bit line pair at time t3 is amplified by the sense amplifier.

At time 5, a column selecting signal CSL corresponding to a selected memory cell column is activated, and the potentials of the bit line pair are transmitted to sub-I/O line pair S-I/O.

At time t6, equalize signal IOEQ for main I/O line pair M-I/O is inactivated (while the inverted signal /IOEQ is at high level), and read enable signal RE is activated in response to an activation of sub-amplifier activation signal SAA. In response to the activation of signals BSj and RE, sub-amplifier SUA is activated, and the potential difference between sub-I/O line pair S-I/O is transmitted to main I/O line pair M-I/O.

At time t7, a pre-amplifier activation signal PAE is activated, and the potential of main I/O line pair M-I/O is transmitted to global I/O bus G-I/O).

At time t8, column selecting signal CSL is inactivated, and a bit line pair and a sub-I/O line pair are isolated.

At time t9, in response to an inactivation of sub-amplifier activation signal SAA, read enable signal RE is inactivated, I/O line pare equalize signal IOEQ is activated, and the potential level of main I/O line pair M-I/O returns to the level of potential Varray.

Note that the precharge potential of sub-I/O line pair S-I/O and the precharge potential of main I/O line pair M-I/O are both at the level of potential Varray, but both precharge potentials are not limited to these potentials and the precharge potential of main I/O line pair M-I/O may be higher than potential Varray supplied to the peripheral circuits.

Through the above operations, a sub-amplifier is activated in response to the activation of both signal BSj transmitted in the row-direction and signal RE transmitted in the column-direction. Thus, the timing control between signals can be readily made for small skew between a signal to control the activation of the sub-amplifier and a signal on a column selecting line, which allows for higher speed accessing operation.

Modification 1 of First Embodiment

In the configuration of sub-amplifiers 462 and 464 shown in FIG. 4, transistor M5 is controlled by signal REi, and transistors M13, M14, M23 and M24 are controlled by signal BSj.

However, the present invention is not limited to this configuration.

Figure 8:
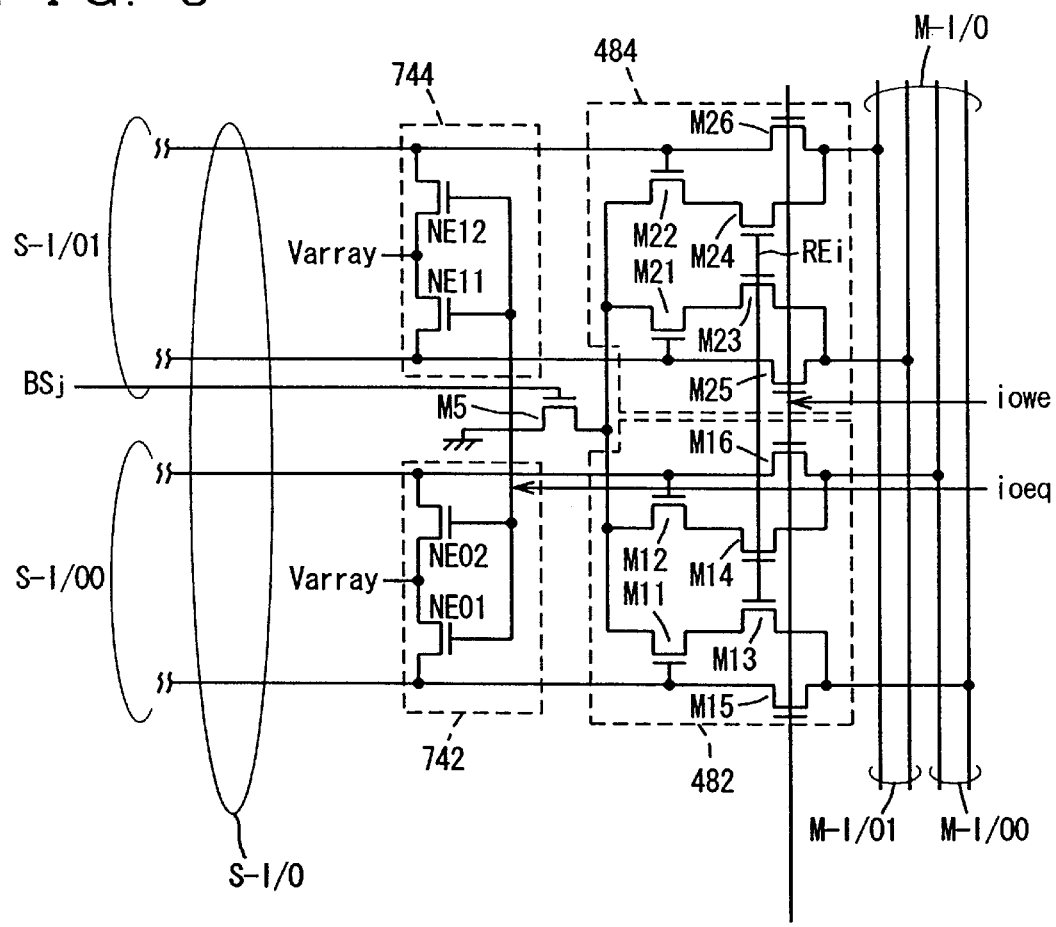
FIG. 8 is a circuit diagram of a modification of the first embodiment of the present invention.

FIG. 8 is a circuit diagram of a modification of the first embodiment. In FIG. 8, transistor M5 is controlled by signal BSj transmitted in the row-direction, and M13, M14, M23 and M24 are controlled by signal REi transmitted in the column-direction.

Thus, the same effect as that brought about by the sub-amplifier shown in FIG. 4 may be provided by this configuration.

More generally, the same effect is provided if transistor M5 is controlled by a signal transmitted in the column-direction while transistors M13, M14, M23 and M24 are controlled by a signal transmitted in the row-direction or if transistor M5 is controlled by a signal transmitted in the row-direction while transistors M13, M14, M23 and M24 are controlled by a signal transmitted in the column-direction.

Modification 2 of First Embodiment

In the example shown in FIG. 5, data is read out from main I/O line pairs M-I/O corresponding to all the regions 100a0 to 100a3 in bank 0 by a single column accessing operation.

However data does not have to be read out from all the main I/O line pairs M-I/O in a bank by a single accessing operation, and data may be selectively read out from a part of main I/O line pairs M-I/O.

Figure 9:
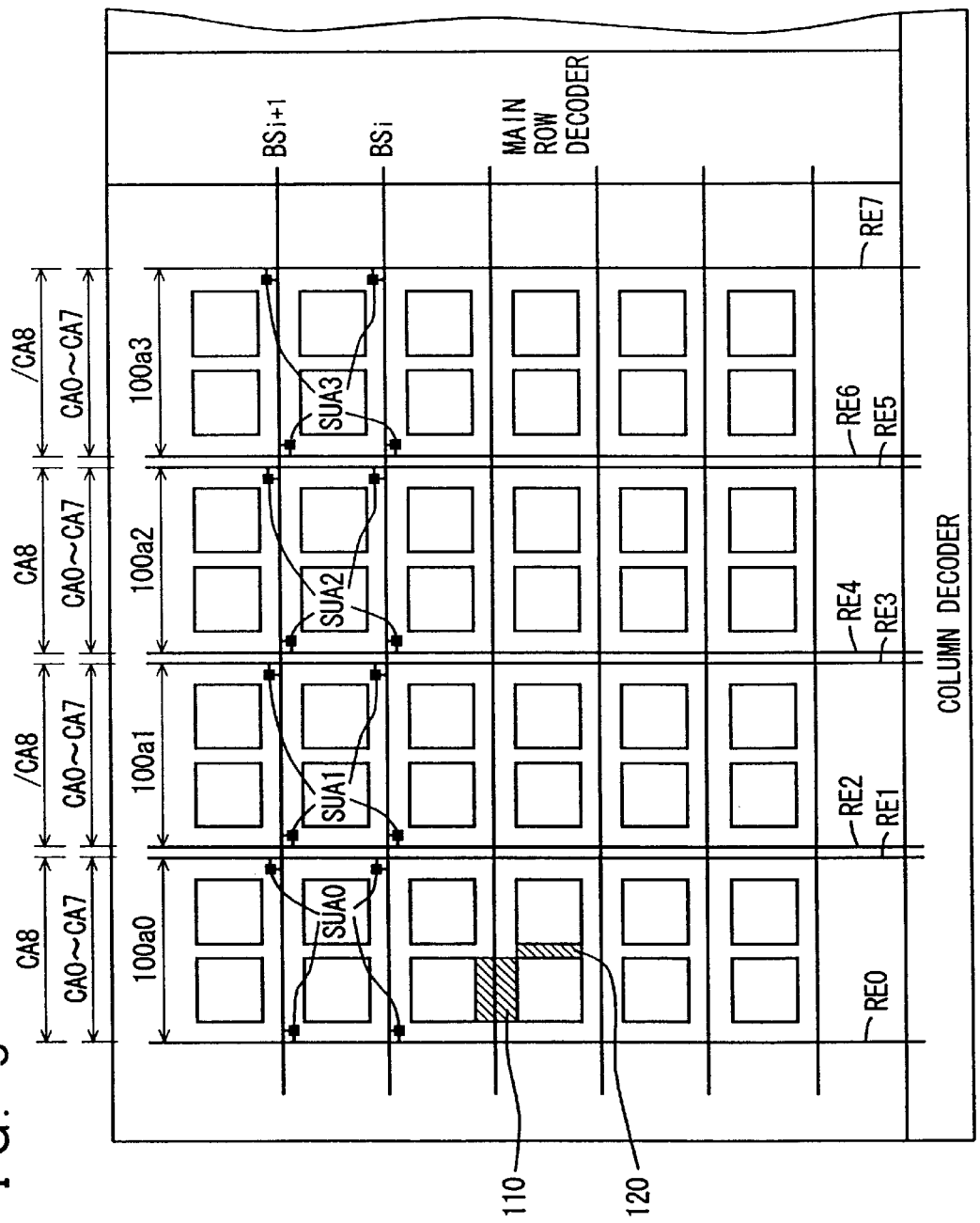
FIG. 9 is a schematic block diagram illustrating how data is selectively read out from a main I/O line pair M-I/O by a single column accessing.

FIG. 9 is a schematic block diagram illustrating how data is selectively read out from main I/O line pair M-I/O.

The configuration shown in FIG. 9 is different from FIG. 5 in that internal column address CA8 corresponds to regions 100a0 and 100a2, while internal column address /CA8 corresponds to regions 100a1 and 100a3. In a memory cell column in each of regions 100a0 to 100a3 is addressed by column addresses CA0 to CA7. Therefore, the read enable signals transmitted through the boundary between regions 100a0 and 100a1 are two signals, signals RE1 and RE2 in order to control sub-amplifiers SUA0 and SUA1 independently.

Similarly, the read enable signals transmitted through the boundary between regions 100a1 and 100a2 are two signals, signals RE5 and RE6 in order to control sub-amplifier SUA2 and SUA3 independently.

Figure 10:
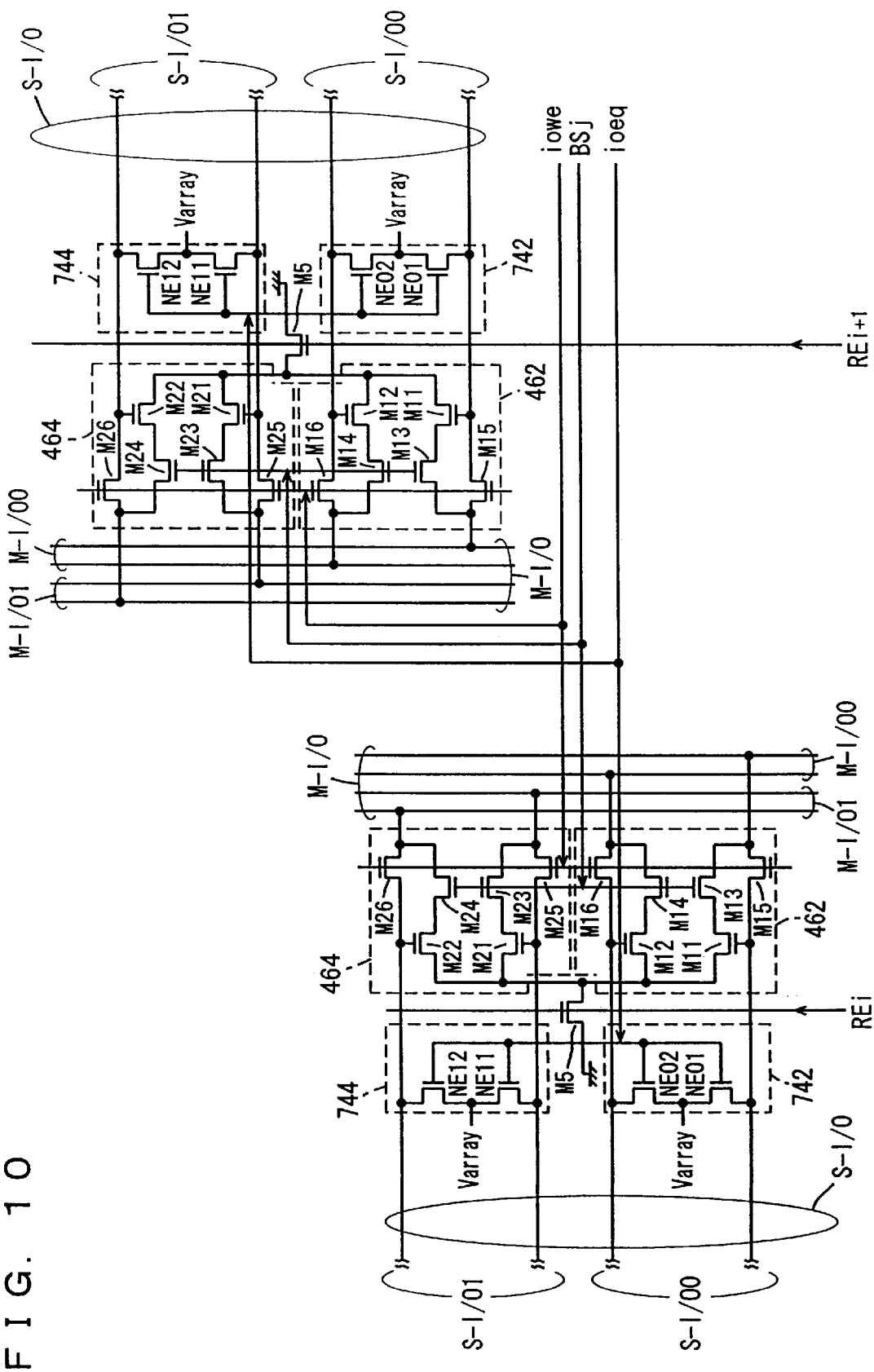
FIG. 10 is a circuit diagram of SUAi and SUAi+1 shown in FIG. 9.

FIG. 10 is a circuit diagram of sub-amplifiers SUAi and SUA+1 (i: 0 to 2) shown in FIG. 9.

Basically, two such configurations as shown in FIG. 4 controlled by signals REi and REi+1 independent from each other are provided side by side. Therefore, the same portions as those in FIG. 4 are denoted by the same reference characters and the description is not repeated.

Note that two such configurations as shown in FIG. 8 may be provided side by side.

Figure 11:
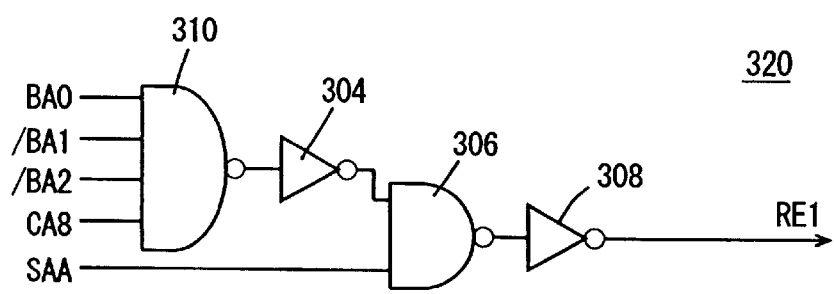
FIG. 11 is a schematic block diagram of a read enable signal generating circuit 320 which generates read enable signals RE0 to RE7 shown in FIG. 9.

FIG. 11 is a schematic block diagram of a read enable signal generating circuit 320 which generates read enable signals RE0 to RE7 shown in FIG. 9.

In FIG. 11, the configuration to generate read enable signal RE1 is shown by way of illustration.

Read enable signal generating circuit 320 includes a 4-input NAND circuit 310 which receives bank selecting signal BA0 at its first input node, and the inverse /BA1 of bank selecting signal BA1 at its second input node, the inverse /BA2 of bank selecting signal BA2 at its third input node, and signal CA8 at its fourth input node, an inverter 304 which receives the output of NAND circuit 310, a 2-input NAND circuit 306 which receives the output of inverter 304 and sub-amplifier activation signal SAA, and an inverter which receives the output of NAND circuit 306 and outputs read enable signal RE1.

Read enable signal generating circuits to generate other read enable signals RE0, RE2 to RE7 have the same configuration.

Read enable signal generating circuits in other banks have the same configuration except that different combinations of bank signals and address signal CA8 are received by NAND circuits 310.

In the above described configuration, data is selectively read out from main I/O line pair M-I/O by a single column accessing operation, and the timing between signals can be readily controlled for small skew between a signal controlling an activation of a sub-amplifier and a signal on a column selecting line, which permits higher speed accessing to be achieved.

Second Embodiment

Figure 12:
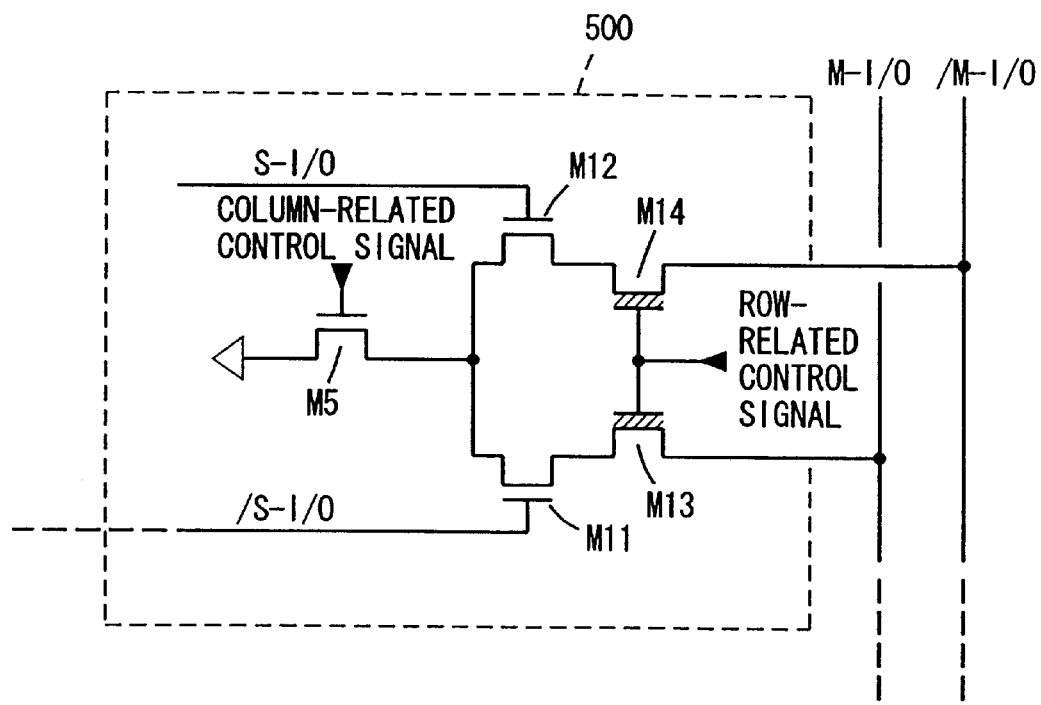
FIG. 12 is a circuit diagram of a sub-amplifier 500 according to a second embodiment of the present invention.

FIG. 12 is a circuit diagram of a sub-amplifier 500 according to a second embodiment of the present invention. Sub-amplifier 500 is different from sub-amplifier 462 according to the first embodiment shown in FIG. 4 in that the threshold voltages of transistors M13 and M14 controlled by signals transmitted in the row-direction (hereinafter as "column-related control signals") are higher than the threshold voltages of transistors M5, M11 and M12 controlled by signals transmitted in the column-direction (hereinafter as "column-related control signals").

As the integration density of semiconductor devices has increased, the operation power supply voltage has been lowered in order to secure the reliability. In this case, the threshold voltages of transistors are likely to be set lower in order to secure the high speed operation of the circuits.

However, thus lowering the threshold voltage of the transistors could cause increase in the sub-threshold leakage current. In sub-amplifier 462 shown in FIG. 4, for example, sub-I/O line pair S-I/O and a main I/O line pair M-I/O are precharged to internal power supply voltage (voltage Varray), and there is a leakage path for example from transistor M14 to transistor M12 and to transistor M5.

However, in the configuration shown in FIG. 12, since the threshold voltage of transistor M14 is set higher than the threshold voltages of transistors M12 and M5, this sub-threshold leakage current is restrained by transistor M14.

In this case, as described in conjunction with FIG. 7, for example, the row-related control signals are activated before the column-related control signals. As a result, if transistors having a higher threshold voltage are used for transistors M14 and M13, the operation speed of sub-amplifier 500 is restrained from being lowered.

The effect of reducing leakage current as described above is brought about in both period A (stand-by period to time t1) and period B (from time t2 to t5).

Modification of Second Embodiment

Figure 13:
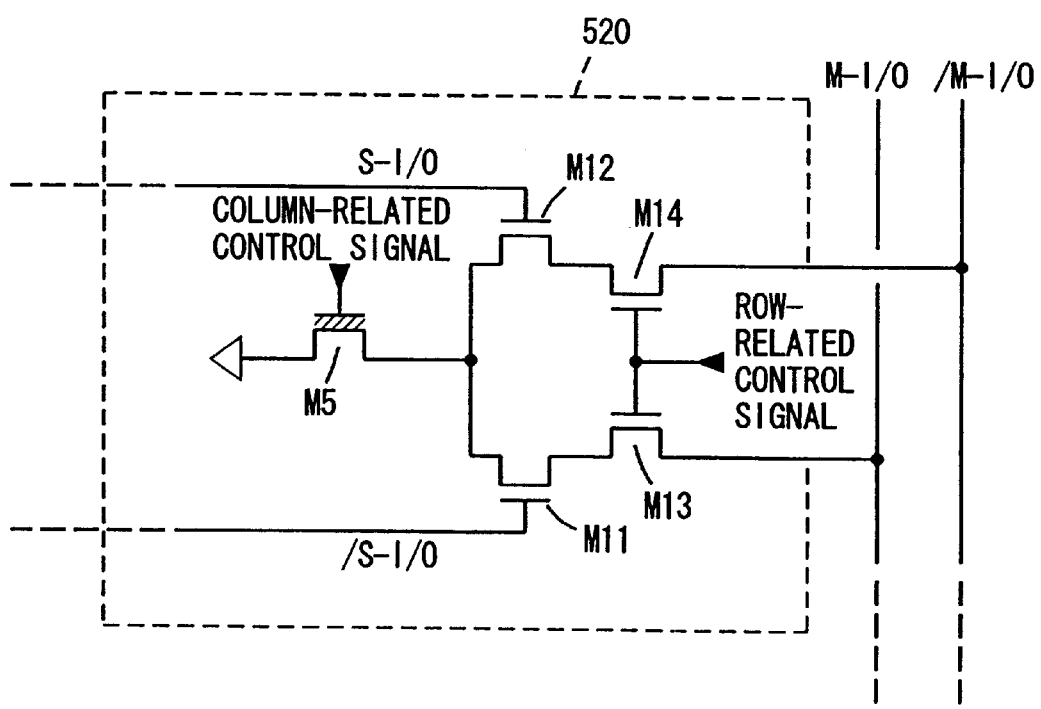
FIG. 13 is a circuit diagram of a sub-amplifier 520 according to a modification of the second embodiment.

FIG. 13 is a circuit diagram of a sub-amplifier 520 according to a modification of the second embodiment of the present invention.

In FIG. 12, the threshold voltages of transistors M13 and M14 controlled by the row-related control signals are set to high values, but in view of lowering leakage current, the threshold voltage of transistor M5 controlled by the column-related control signals may be set high. In FIG. 13, the threshold voltage of transistor M5 is set higher than the threshold voltages of transistors M11, M12, M13 and M14.

In the description in conjunction with FIGS. 12 and 13, transistors M13 and M14 are controlled by the row-related control signals, while transistor M5 is controlled by the column related signals, but transistors M13 and M14 may be controlled by the column-related signals, while transistor M5 may be controlled by the row-related control signals.

Third Embodiment

Figure 14:
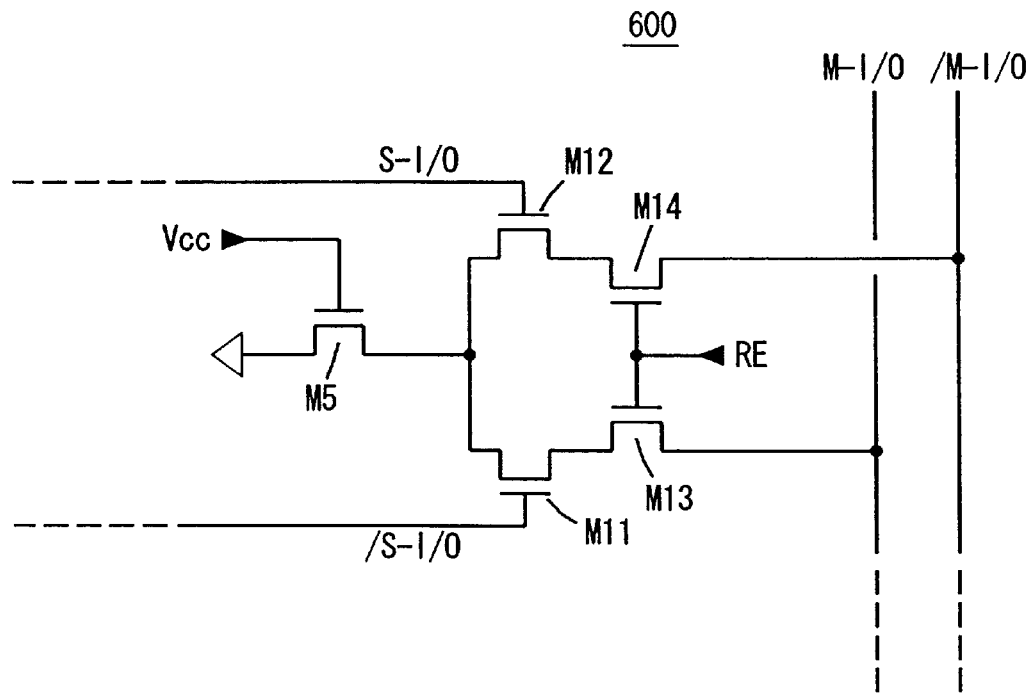
FIG. 14 is a circuit diagram of a sub-amplifier 600 according to a third Embodiment of the present invention.

FIG. 14 is a circuit diagram of a sub-amplifier 600 according to a third embodiment of the present invention. The third embodiment is different from sub-amplifier 462 according to the first embodiment in the following point.

The size (gate width) of transistor M5 is set smaller than the size of the other transistors M11 to M14, and then the gate potential of transistor M5 is fixed, for example, at the level of internal power supply potential Vcc.

Herein, transistors M13 and M14 are for example controlled by a column-related control signal, read enable signal RE.

Thus, transistor M5 operates as a current limiter for the discharge current of a main I/O line pair. In this case, since it takes considerable time for sub-I/O line pair S-I/O to have a prescribed potential difference, the potentials of both M-I/O and /M-I/O of main I/O line pair are once pulled down to the ground potential side, so that it will not take long for the potential difference between M-I/O and M-I/O of the main I/O line pair to reach a desired potential level.

Modification of Third Embodiment

In sub-amplifier 600 shown in FIG. 14, transistor M5 has a gate width smaller than the other transistors and the gate potential is set to a fixed valued. The potential of transistor M5 does not have to be set to such a fixed value and may be a dynamically changing potential.

Figure 15:
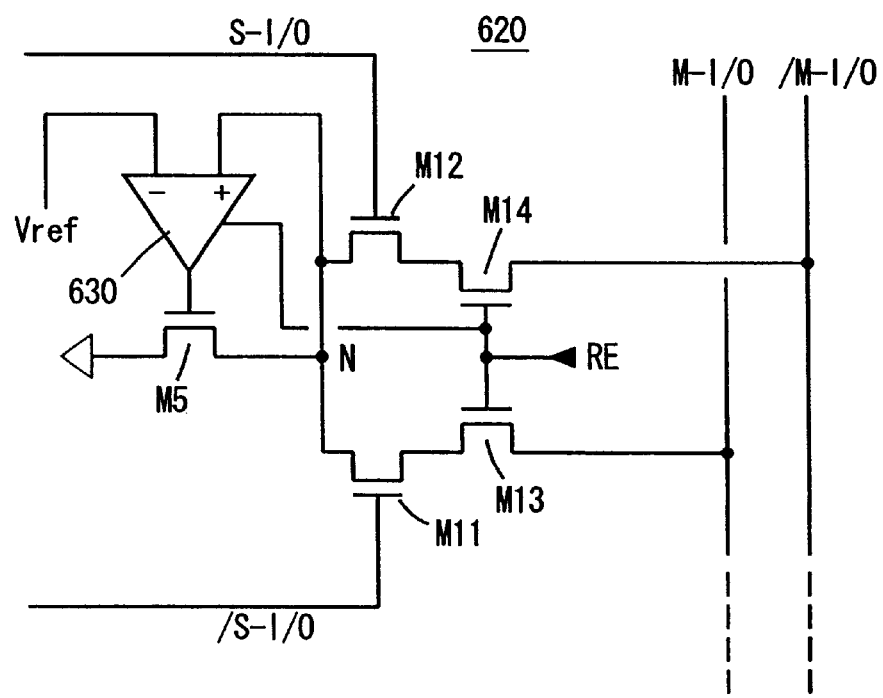
FIG. 15 is a circuit diagram of a sub-amplifier 620 according to a modification of the third embodiment.

FIG. 15 is a circuit diagram of a sub-amplifier 620 according to a modification of the third embodiment. The modification is different in that the gate potential of transistor M5 is controlled by the output of a differential amplifier 630.

Differential amplifier 630 is activated in response to an activation of signal RE which activates the sub-amplifier and has its +input node connected to a node N to which the sources of transistors M11 and M12 are connected in common, and its −input node receives a reference potential Vref.

If the optimum value in design is present at the potential level of node N, the value is used as reference potential Vref and the gate potential of transistor M5 is controlled by the dynamically changing output potential of differential amplifier 630.

This configuration can provide the same effect as sub-amplifier 600 shown in FIG. 14.

Figure 16:
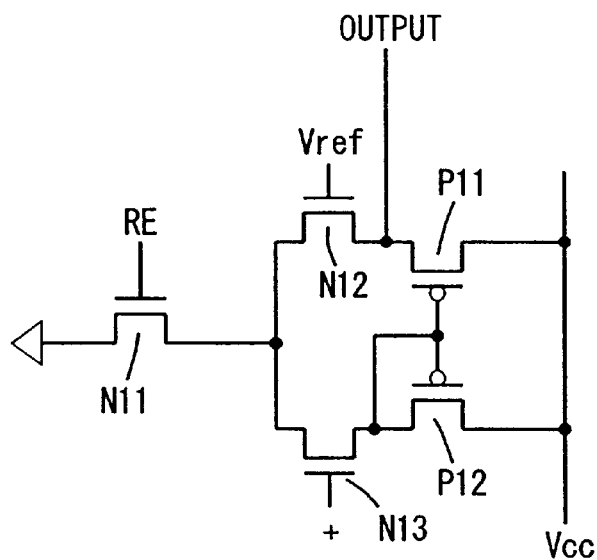
FIG. 16 is a circuit diagram of an example of a differential amplifying circuit 630 shown in FIG. 15.

FIG. 16 is a circuit diagram of an example of differential amplifier 630 shown in FIG. 15. An activation/inactivation of a well-known current mirror-type differential amplifier formed by N-channel MOS transistors N12, N13 and P-channel MOS transistors P11, P12 is controlled by an N-channel MOS transistor N11 which conducts in response to signal RE.

Fourth Embodiment

Figure 17:
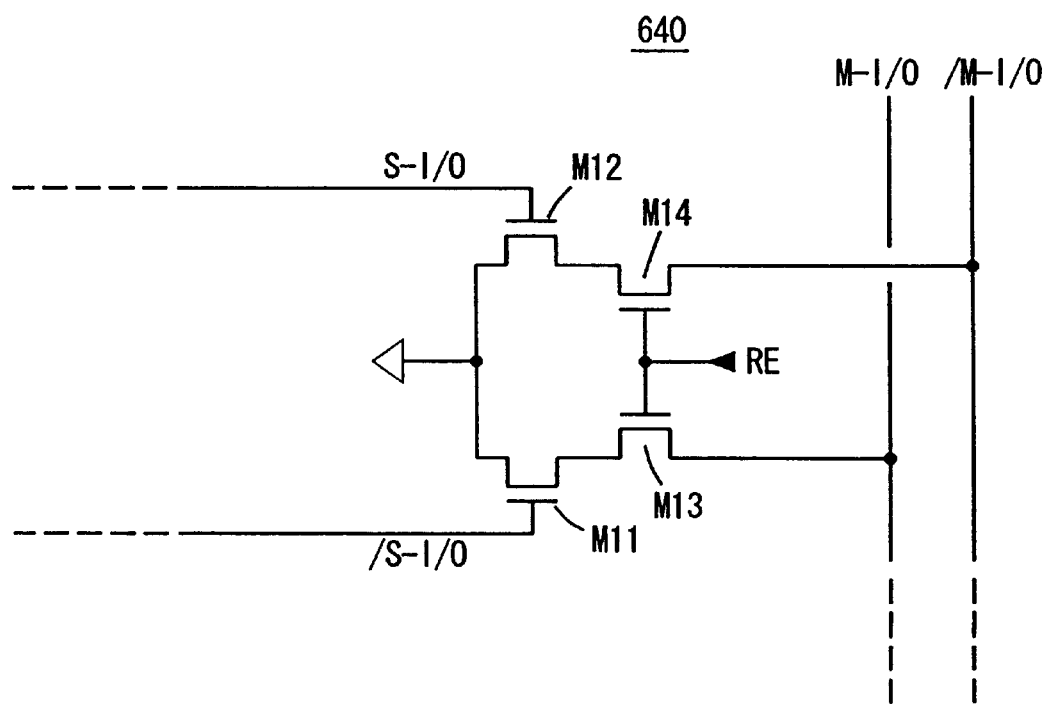
FIG. 17 is a circuit diagram of a sub-amplifier 640 according to a fourth embodiment of the present invention.

FIG. 17 is a circuit diagram of a sub-amplifier 640 according to a fourth embodiment of the present invention. The fourth embodiment is different from sub-amplifier 462 according to the first embodiment in that the sources of transistors M11 and M12 directly receive the ground potential. The other features are the same as those of sub-amplifier 462 according to the first embodiment, and therefore the same portions are denoted by the same reference characters and the description is not repeated.

Thus, the number of elements is reduced, skew between a signal controlling the activation of the sub-amplifier and a signal on a column selecting line is small and the timing between the signals can be readily controlled while the removal of transistor M5 allows for even faster accessing operation.

In the configuration shown in FIG. 17, the threshold voltages of transistor M13 and M14 may be set higher than the threshold voltage of transistors M11 and M12, in order to reduce the sub-threshold leakage current similarly to the case of sub-amplifier 500 shown in FIG. 12.

Fifth Embodiment

In the foregoing, a main I/O line pair is provided in common to a plurality of memory cell blocks.

However, each of the memory cell blocks may work as a bank to/from which data can be independently written/read, and a common data line pair for reading or writing data may be provided in common to the banks.

In this multi-bank arrangement, only a bank to which a selected memory cell belongs can be selectively operated, and power consumption and noise generated by a sense amplifier or a sub-amplifier may be reduced.

Figure 18:
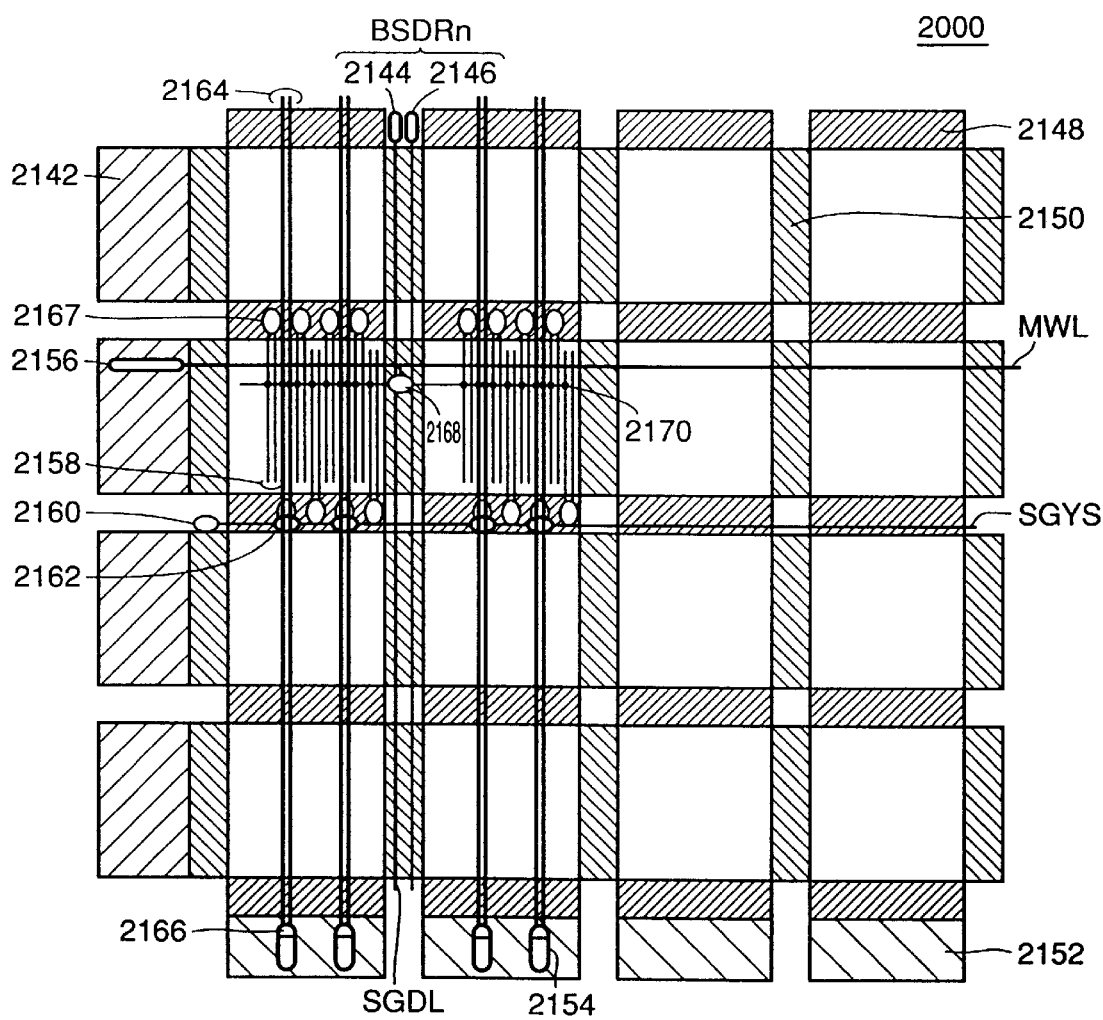
FIG. 18 is a schematic block diagram of a memory cell array 2000.

FIG. 18 is a schematic block diagram of a memory cell array 2000 having the above-described arrangement.

Referring to FIG. 18, memory cell array 2000 is segmented on the basis of a memory cell array surrounded by a sense amplifier band 2148 and a sub driver band 2150. Memory cell array 2000 is activated on the basis of such a memory cell array unit.

A main word line MWL is provided in common to memory cell array units to activate a sub word driver 2168. In response to the activation of sub-word driver 2168, a corresponding sub-word line 2170 is activated. Sense amplifiers 2167 are alternately provided with memory cell array units inbetween.

Meanwhile, a sense amplifier belonging to a region in which a selecting line for a region (bank) to be activated and a sense selecting line crosses is activated.

A segment YS line SGYS is provided across the sense amplifier band in the word direction of the memory cell array units.

In a data reading operation on a memory cell array basis, a segment YS line SGYS is activated and a region (bank) in which segment YS line SGYS and a bank selecting line cross is activated. A single piece of data is read out for each of four sense amplifiers for example from an activated region (bank).

The read out data is transmitted to a read/write amplifier (hereinafter R/W amplifier) 2154 through a data line pair 2164 running in the direction perpendicular to a word line on the memory cell array.

Subsequently, the read data is transmitted to a data output portion through a peripheral circuit or a data bus region. Alternatively, if a chip includes both a memory and a logic circuit, the data is transferred to a logic portion through a data bus region.

More specifically, memory cell array 2000 includes memory mats arranged in a matrix of 4 rows and 4 columns, there is provided a main word driver group included in a main row decoder 2142 corresponding each row, and an I/O selector 2152 is provided for each column. A sense amplifier band 2148 and a sub-word driver band 2150 are provided for each of the memory mats (banks).

The selecting operation of row-related circuitry will be now described. A main word line MWL is selectively activated by a main word line driver 2156 in response to a row address signal. A segment decode line SGDL (including a bank selecting line BSL, a selecting line SL and a reset line RSL) is activated by an SD driver 2144. A corresponding sub-word driver 2168 is activated by main word line NWL and a segment decode line SGDL, and a sub-word line 2170 is activated accordingly, and an access transistor connected to a selected memory cell conducts. Herein, selecting line SL generically represents four selecting lines SL0 toSL3.

Reset line RSL generically represents four reset lines RSL0 to RSL3.

Accordingly, data is output to a bit line pair 2158 provided corresponding to a selected memory cell column.

The selecting operation in the column-direction will be described. Segment YS line SGYS is activated by a segment YS driver 2160. Herein, segment YS line SGYS includes 4 read source lines RGL0 to RGL3, and 4 write activation lines WRL0 to WRL3. In response to an activation of line SGYS, a corresponding I/O gate (sub-amplifier) 2162 is selectively activated, and one of the output signals of the four sense amplifiers is externally read out through data line pair 2164.

For data line pair 2164, a precharge circuit 2166 is provided, and before a reading operation, a data line pair forming I/O line 2164 are precharged to the level of power supply potential Vcc.

Note that read source lines RGL0 to RGL3 are generically represented by read source line RGL and write activation lines WRL0 to WRL3 are generically represented by write activation line WRL.

Figure 19:
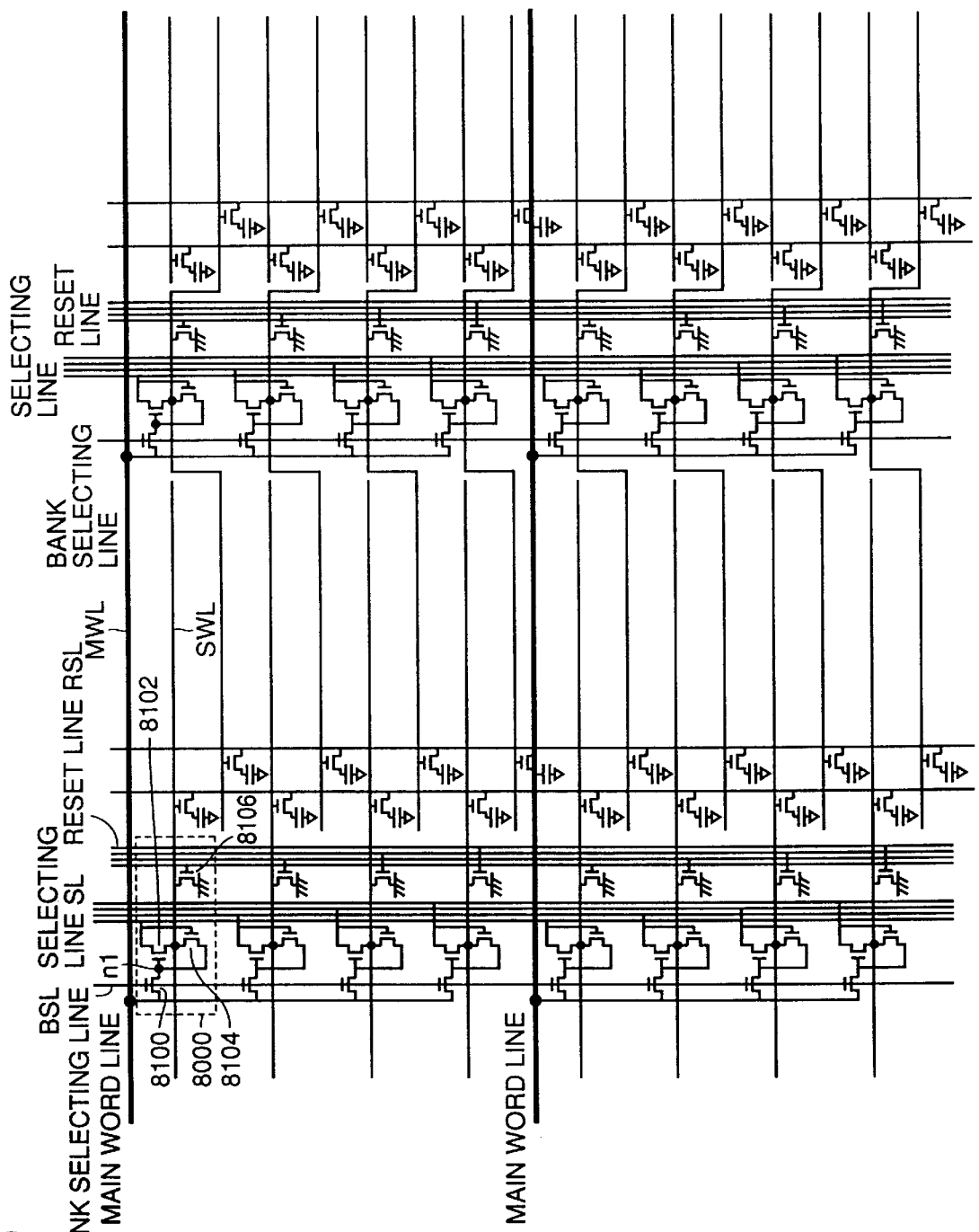
FIG. 19 is a detailed circuit diagram of a sub-word driver band BSDRn.

FIG. 19 is a circuit diagram showing in detail a sub-word driver band BSDRn shown in FIG. 18.

A driver circuit 8000 includes a select transistor 8100 having its gate controlled by a bank selecting line BSL and provided between a main word line and an internal node n1, a transistor 8102 having a gate connected to node n1 and connected between one of selecting lines SL, selecting line SL0 and sub-word line SWL, and a transistor 8104 having a gate potential controlled by the same selecting line SL0 as that of transistor 8102 and connected between sub-word line SWL and node n1. The circuit further includes a transistor 8106 having a gate potential controlled by reset line RSL0 and provided between a sub-word line and the ground potential/

The other main word lines and sub-word lines have the same configurations.

Thus, main word line MWL is activated, a bank selecting line BSL is activated, which activates any of selecting lines SL, so that a corresponding word line SWL attains an activated state (high potential), and reset line RSL is selectively activated to discharge a corresponding sub-word line to the ground potential/

In the example shown in FIG. 19, one main word line MWL controls four sub-word lines in each of the banks, and which to select among sub-word lines SWL is specified by an activation of one of selecting lines SL.

Bank selecting line BSL attains a boosted voltage Vpp level when activated, and changes to a ground potential Vss level after a sub-word line SWL is activated. In this case, a latch circuit including transistor 8102 and 8104 holds the activated state of bank selecting line BSL. Selecting line SL and reset line RSL are controlled to have potential levels complementary to each other.

In a stand-by operation, bank selecting line BSL is at the ground potential (GND) level, and reset line RSL is at the power supply potential (Vcc) level.

In an activating operation, a corresponding reset line is pulled to the ground potential (GND) level, a bank selecting line BSL corresponding to a sub-word line SWL to be activated is activated, and the potential level becomes the boosted potential Vpp level.

Subsequently, main word line MWL is activated to. attain a power supply potential (Vcc) level. Almost simultaneously with the activation of main word line MWL, one of selecting lines SL attains the power supply potential (Vcc) level, and sub-word line SWL attains the (Vcc–Vth) level. Then, bank selecting line BSL changes its level to the ground potential (GND) level, and charge is enclosed in a latch circuit 8000 in the driver circuit.

With the charge being enclosed by transistors 8102 and 8104, if the potential level of a selected one of selecting lines SL is raised to the boosted potential (Vpp) level, the level of sub-word line SWL changes to the level of boosted potential (Vpp) level.

At the time of a resetting operation, a bank selecting line is raised to the level of the power supply potential (Vcc), and selecting line SL is pulled to the ground potential (GND) level. Furthermore, by pulling a reset line to the power supply potential (Vcc) level, the charge stored in sub-word line SWL is discharged.

Thus, the number of elements forming sub-word line driver 8000 can be reduced to only four, the number of the N-channel MOS transistors.

As will be described, a main word line is activated in the form of a one-shot-pulse. More specifically, once the activated state of the main word line is held by transistors 8102 and 8104 in sub-word driver 8000 corresponding to a selected word line, the potential level of the main word line is reset. Thus, as shown in FIG. 18, if a plurality of banks are arranged in the direction of a main word line, the potential level of the main word line will not affect sub-word driver 8000 as long as bank selecting line BSL is not activated. As a result, two banks adjacent to each other in the row-direction as shown in FIG. 18 can be operated independently from each other.

Figure 20:
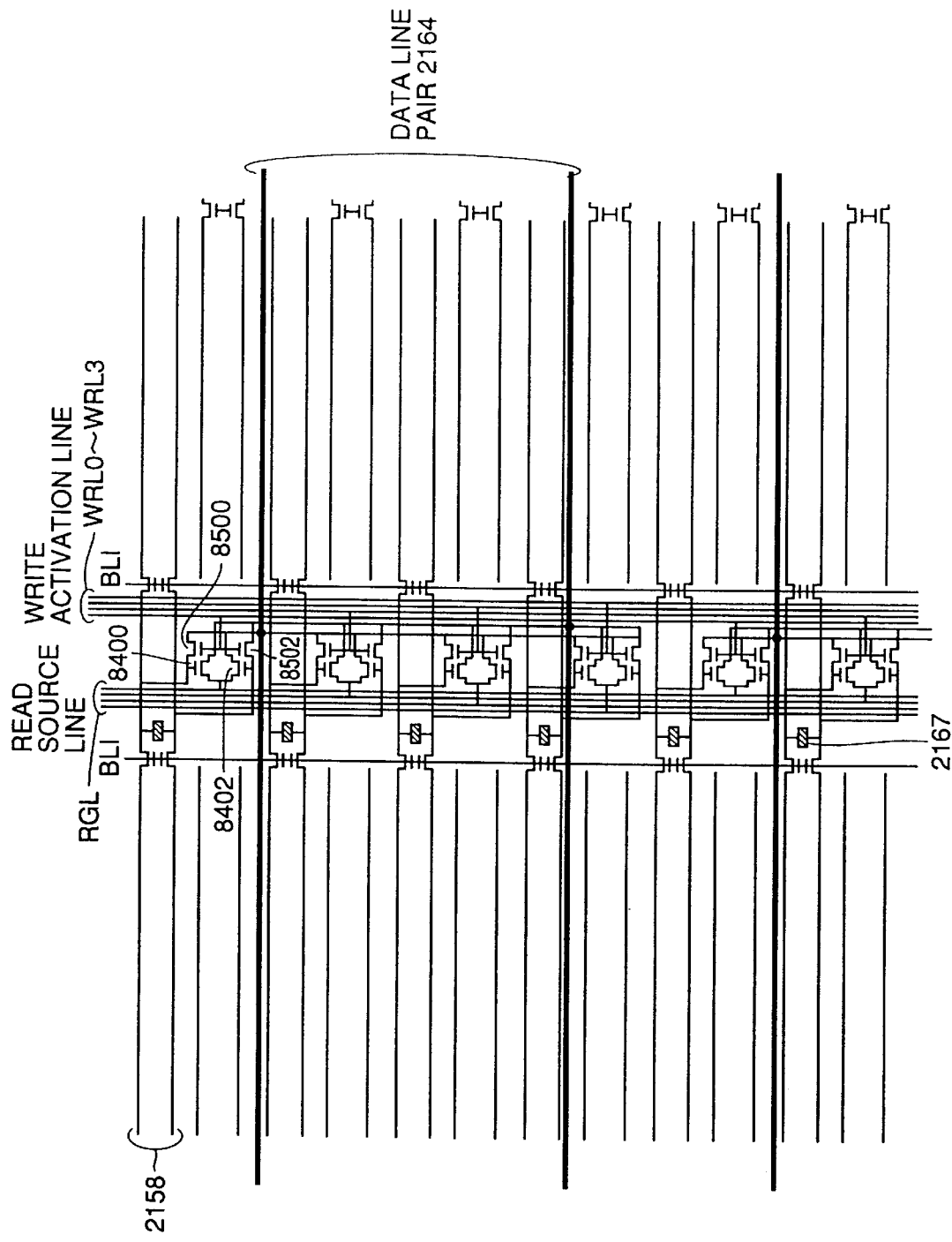
FIG. 20 is a circuit diagram illustrating how a sense amplifier portion and a data line portion are connected.

FIG. 20 shows a structure of the sub-amplifier 2162 and a circuit diagram of how a sense amplifier portion and a data line portion are connected.

A data signal from the I/O node of a sense amplifier is transmitted to a data line pair DL, /DL via transistors 8400 and 8402 which have gates receiving the data signal.

More specifically, the sources of transistors 8400 and 8402 are selectively brought to the ground potential by read source line RGL, the gates of transistors 8400 and 8402 are each connected to the I/O node of a corresponding sense amplifier S/A, and the drains of transistors 8400 and 8402 are each connected to a corresponding data line pair DL, /DL.

In the configuration shown in FIG. 20, the four sense amplifiers share a single data line pair DL, /DL.

Meanwhile, in a writing operation, data line pair DL, /DL are selectively connected by transistors 8500 and 8502 connected between a corresponding bit line BL and a data line DL and a corresponding bit line /BL and a data line /DL, respectively.

More specifically, the I/O nodes of sense amplifiers S/A0 to S/A3 corresponding to bit line pairs BL0, /BL0 to BL3, /BL3 are selectively connected to data line pair DL, /DL by transistors 8500 and 8502 having their gate potentials controlled by write activation lines WRL0 to WRL3.

Segment YS shown in FIG. 18 includes read source lines RGL (generically representing read source lines RGL0 to RGL3), and write activation line WRL (which generically represents write activation lines WRL (generically representing write activation lines WRL0 to WRL3) as described above.

Thus, in a data reading operation, data line pair DL, /DL and the I/O node of a corresponding sense amplifier are not directly connected, and the gates of transistors 8400 and 8402 are driven by the potential level of the I/O node of the sense amplifier to allow the level of data line pair DL, /DL to change, so that a reading operation is enabled without destroying data if an operation of selecting a memory cell column based on a column address signal, in other word an operation of selecting any of read source lines RGL0 to RGL3 overlaps with an amplifying operation by a sense amplifier or if the selecting operation precedes the amplifying operation.

This means that the reading operation can be performed at a higher speed. In addition, since a sense amplifier needs only be activated each for a limited region, the peak value of the operation current can be restrained, which advantageously reduces the power consumption and noises.

Figure 21:
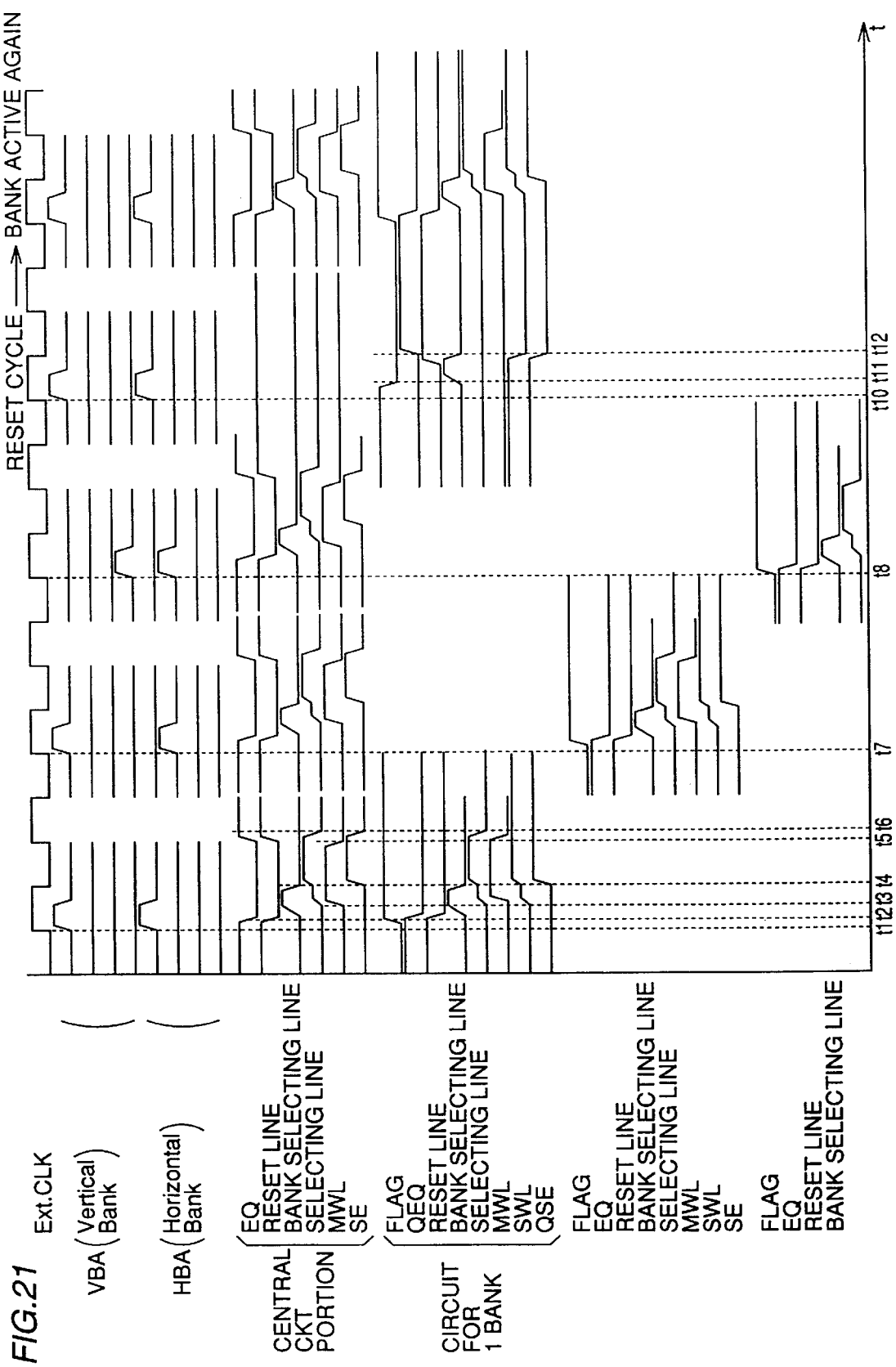
FIG. 21 is a timing chart for use in illustration of the operation of a semiconductor memory device according to a fifth embodiment of the present invention.

FIG. 21 is a timing chart for use in illustration of the operation of an SDRAM 1000 according to the fifth embodiment described above.

Referring to FIG. 21, at the activation edge of an external dock signal Ext. CLK at time t1, a signal VBA having an address in the vertical direction of the bank arranged in a matrix of 4×4 shown in FIG. 18 and a signal HBA having an address in the horizontal direction are provided.

Accordingly, at time t2, in response to bank address signal HBA in the horizontal direction, bank selecting line BSL is activated in the form of a one-shot-pulse signal, and in response to bank address signal VBA in the vertical direction, segment YS line SGYS is activated, a flag signal FLAG indicating an activation of a bank selected in a local control circuit provided succeeding to each of banks is activated. In response to an activation of bank selecting signal BSL, transistor 8100 conducts.

Meanwhile, at time t2, an equalize signal EQ to instruct an equalizing operation of a bit line pair or an I/O line pair, and a reset signal RSL to reset a sub-word line level are inactivated (pulled to an "L" level).

At time t3, in response to a row address signal, a main word line MWL is selectively activated to the power supply potential level Vcc, and one of selecting lines SL is almost simultaneously activated to the Vcc level.

At time t4, bank selecting line BSL attains an inactive level (GND level), while selecting line SL is driven to the boosted potential level (Vpp level). Accordingly, a selected sub-word line SWL is also driven to the boosted potential level.

Then, sense amplifier activation signal SE attains an active state at time t4, and data read out from a memory cell connected to the selected sub-word line SWL is amplified.

At time t5, main word line MWL is inactivated, at time t6, selecting line SL is inactivated, and the level of the selected sub-word line SWL is maintained at the active level (Vpp level).

Sense amplifier activation signal SE externally applied to memory cell array 2000 attains an inactive state at time t6, sense amplifier activation signal lSE in a selected bank maintains its active state.

At the activation edge of external clock signal Ext. CLK at time t7, a signal VBA indicating an address in the vertical direction and an address signal HBA indicating an addresses in the horizontal direction in the 4×4 banks different from the addresses provided at time t1 and t7 are applied. Thereafter, the same operations as those from time t1 to t6 are performed for reading data for this selected bank.

Further at an activation edge of external clock signal Ext.CLK at time t8, a signal VBA indicating an address in the vertical direction and a signal HBA in the horizontal direction indicating an address in the 4×4 banks different from those applied at time t1 and t7 are applied. Thereafter, the same operations as those at time t1 to t6 are performed for a reading operation.

At time t10, a signal VBA indicating an address in the vertical direction and a signal HBA indicating an address in the horizontal direction to address a bank for resetting are provided. At time t11, the selected bank selecting line BSL is activated, and flag signal FLAG which has indicated an activation of the bank is inactivated accordingly.

Then, at time t12, reset line RSL attains an active state, and sub-word line SWL attains an inactive state. Meanwhile, a sense amplifier activation signal is inactivated, and then equalize signal EQ is activated to complete a resetting operation.

Subsequently, once again in response to an externally applied bank address signal, a bank is selected and activated.

Thus, when each of the memory cell array units formed by dividing the memory cell array in the row-direction and column-direction operates as a bank and word lines are operated in a hierarchical manner, the number of transistors forming a sub-word driver can be reduced.

Furthermore, as described above, only a bank to which a selected memory cell belongs can be selectively operated, so that the power consumption and noises caused in a sense amplifier or sub-amplifier can be reduced.

Sixth Embodiment

The fifth embodiment relates to a bank where data can be written/read to/from each of memory cell blocks independently from each other, and a data line pair for reading/writing data is provided in common to the bank. More specifically, as shown in FIG. 18, each of memory cell blocks arranged in the row-direction and column-direction operates as a bank, in other words, the multi-bank arrangement has been described.

The multi-bank arrangement according to a sixth embodiment where a plurality of memory cells (hereinafter simply as m (m: natural number) arranged in the row-direction among memory cell blocks arranged in a matrix of rows and columns operate as a single bank will be now described.

Hereinafter, the multi-bank configuration, data transmission from a memory cell column to a data line (I/O line pair) will be now described.

Problems Associated with Data Transmission Portion in Multi-bank Arrangement

Figure 22:
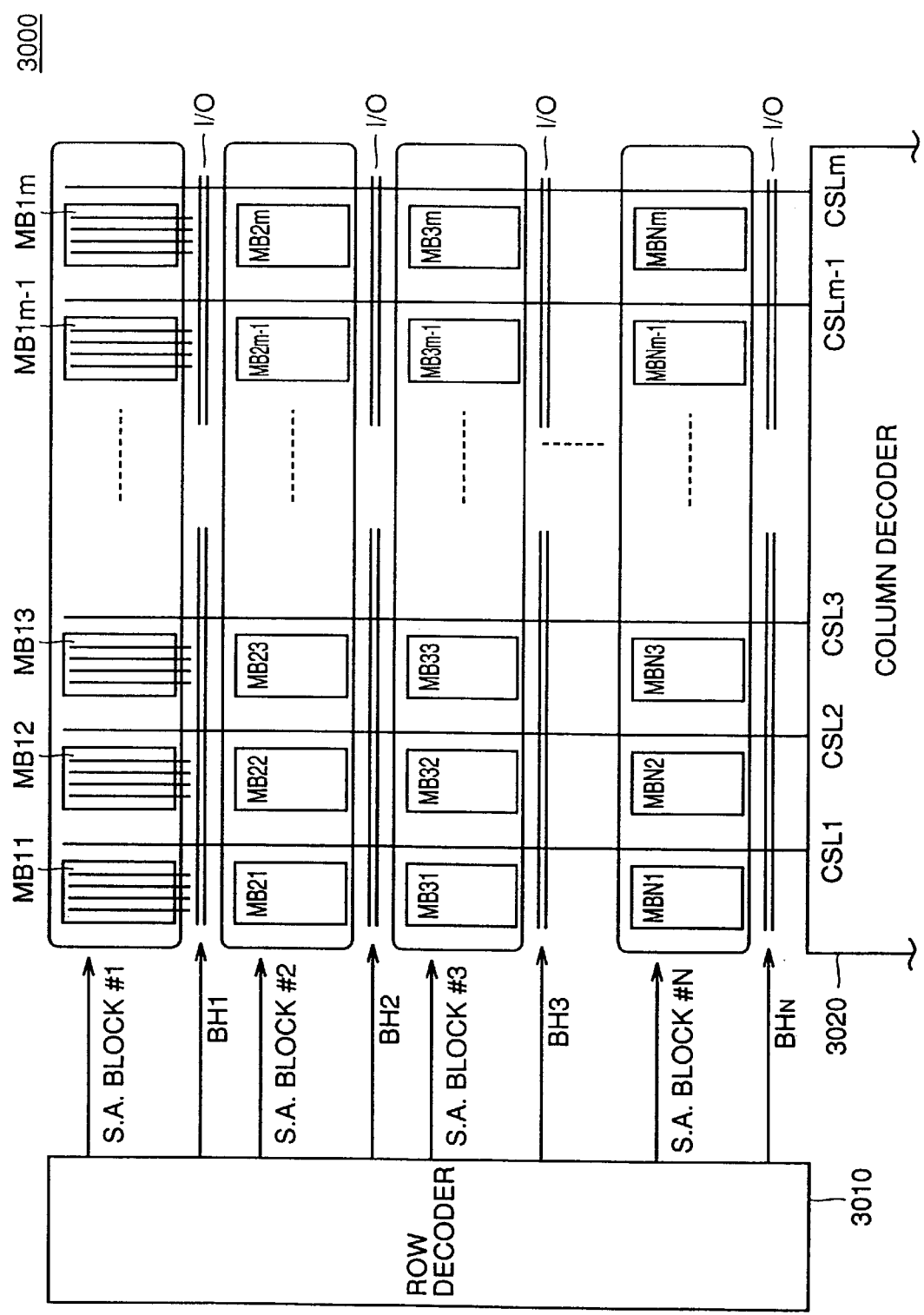
FIG. 22 is a schematic block diagram of a memory cell array 3000.

FIG. 22 is a schematic block diagram for use in illustration of a memory cell array 3000 in a multi-bank arrangement as described above.

Referring to FIG. 22, memory cell blocks MB11 to MB1m arranged in the first row in the row-direction corresponds to one bank. Similarly, memory cell blocks MB21 to MB2m form one bank. Similarly, MBN1 to MBNm arranged in the N-th row (N: natural number) form a single bank. The first to N-th banks BK1 to BKN correspond to sense amplifier blocks SAB#1 to SAB#N, respectively, and a sense amplifier band provided corresponding to each bank is activated in response to an activation of a corresponding bank.

Such a bank arrangement will be hereinafter referred to as a "horizontally divided bank arrangement". Note however that if a sense amplifier is shared at a boundary between banks and a certain bank is activated, adjacent banks must be inactive. In order to implement simultaneous activation of adjacent banks, both banks should be provided with separate sense amplifiers rather than with a shared amplifier at the boundary.

Memory blocks MB1 to MBNm, though not limited, each include four memory cell columns, in other words, four bit line pairs BL1, /BL1 to BL4, /BL4.

Bank selecting signal lines BH1 to BHN to instruct an activation of a bank are provided in the row-direction of the bank, and I/O line pairs I/O1 to I/ON to transmit 4-bit data read out from a selected memory cell block are provided.

Meanwhile, in the column direction of memory cell blocks, column selecting lines CSL1 to CSLm to instruct which memory cell block to be activated are provided.

More specifically, in the configuration shown in FIG. 22, a plurality of banks are arranged in the lengthwise direction of the column selecting lines, and one column selecting line is shared by a plurality of banks (N banks).

A row decoder 3010 responds to an externally applied address signal to select a corresponding row (word line) and a corresponding bank. A column decoder 3020 responds to an externally applied address signal to select a corresponding column, in other words, to selectively activate a column selecting line.

Figure 23:
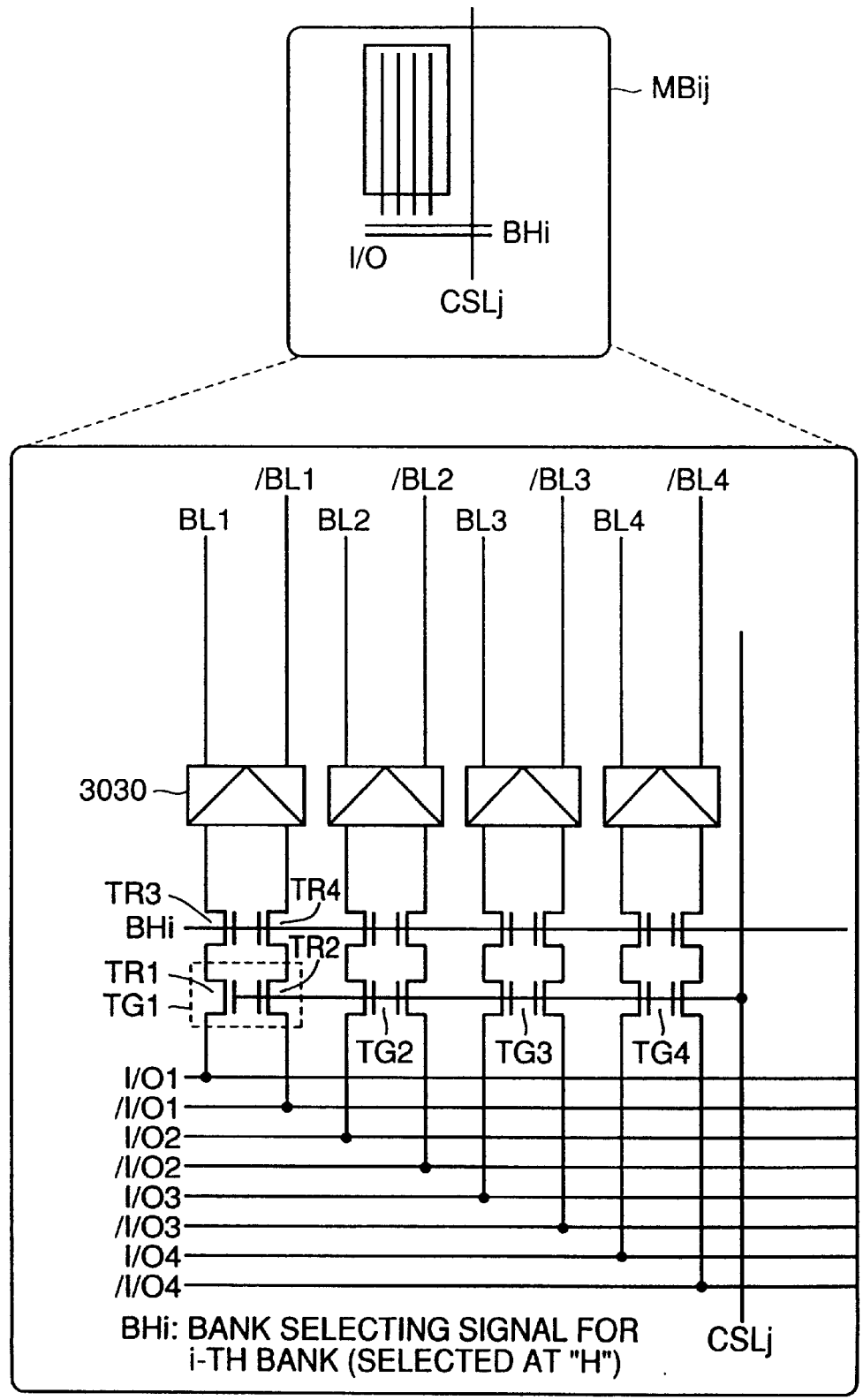
FIG. 23 is a diagram of how data is transmitted from a bit line pair in a single memory cell block to an I/O line pair in the configuration shown in FIG. 22.

FIG. 23 shows how data is transmitted from four bit line pairs BL1, /BL1 to BL4, /BL4 included in one memory cell block MBij (i: 1 to N, j: 1 to m) to I/O line pairs I/O1, /I/O1 to I/O4, /I/O4 in the multi-bank arrangement as shown in FIG. 22.

A sense amplifier 3030 is provided for each of bit line pairs BL1, /BL1 to BL4, /BL4 to amplify data in a selected memory cell.

First transfer gates TG1 to TG4 are provided between bit line pairs BL1, /BL1 to BL4, /BL4 and corresponding I/O line pairs I/O1, /I/O1 to I/O4, /I/O4, respectively. First transfer gates TG1 to TG4 each include N-channel transistors TR1 and TR2 provided between a corresponding bit line pair and a corresponding I/O line pair and having a gate potential controlled by a column selecting line CSLj.

Second transistor gates TB1 to TB4 are provided between transfer gates TG1 to TG4 and corresponding bit line pairs BL1, /BL1 to BL4, /BL4, respectively. Second transfer gates TB1 to TB4 each include N-channel transistors TR3 and TR4 provided between a corresponding bit line pair and a corresponding first transfer gate and having a gate potential controlled by a bank selecting line BHi.

More specifically, in the configuration shown in FIG. 23, the connection between a bit line pair and a data I/O line pair is disconnected in a column in a non-selected bank and is allowed to conduct a column in a selected bank, so that the first transfer gate controlled by column selecting line CSLj and the second transfer gate controlled by bank selecting line BHi are connected in series.

Such simple structure is however encountered with the following problems.

Firstly, since the first transfer gate and the second transfer gate are connected in series, the resistance value of the connection portion is high, which causes the speed of data reading and writing operations to be lowered, in other words, the accessing time is increased.

Secondly, the layout area of the series-connected transfer gates is large, which increases the chip size.

Configuration to Restrain Accessing Time in Horizontally Divided Bank Arrangement (1)

Figure 24:
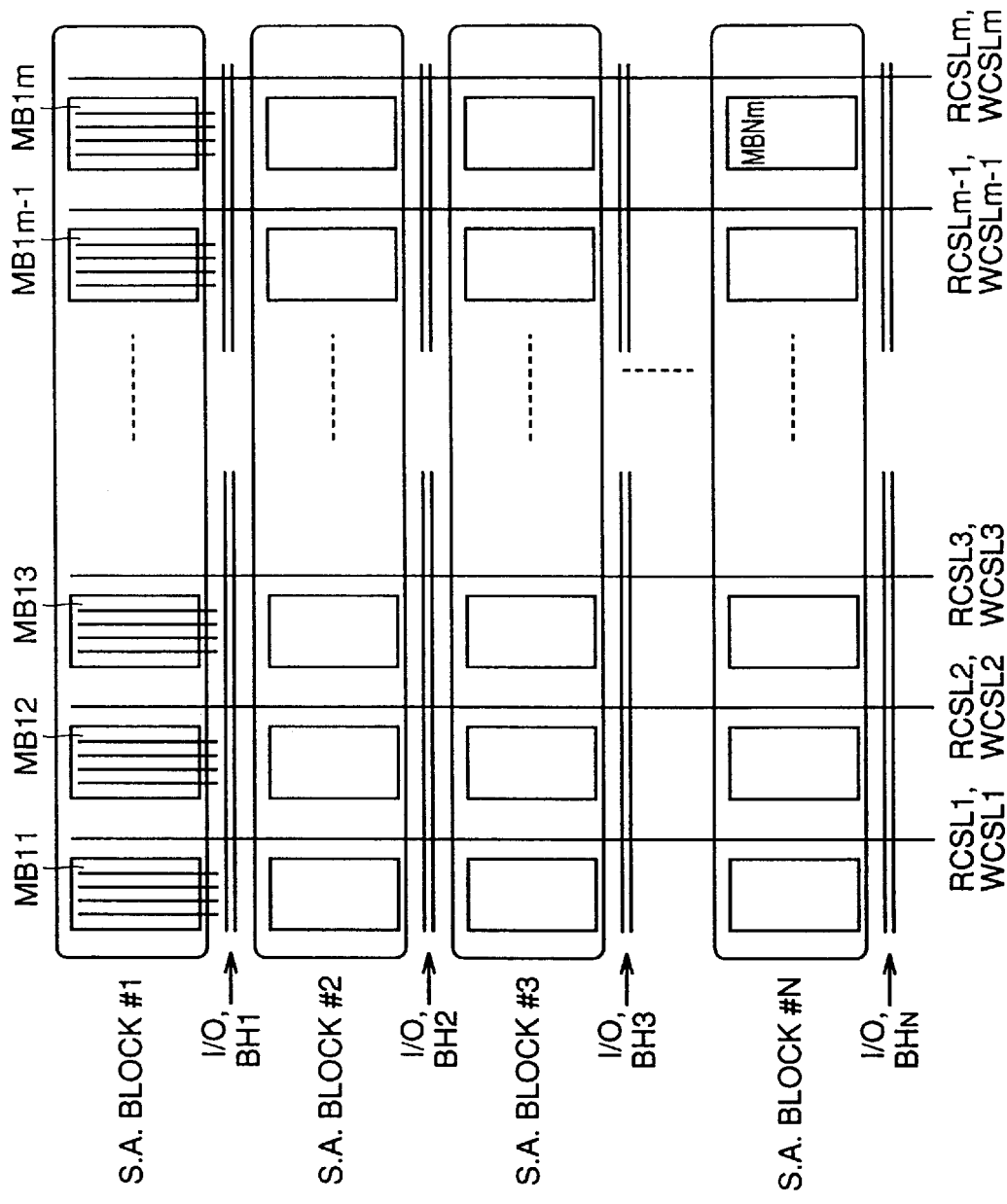
FIG. 24 is a schematic block diagram of a memory cell array 3200.

FIG. 24 is a schematic block diagram of a memory cell array 3200 for solving the above described first problem.

Memory cell array 3200 is different from memory cell array 3000 in that there are two kinds of column selecting lines, i.e., reading column selecting lines RCSL1 to RCSLm and writing column selecting lines WCSL1 to WCSLm, and that there are two kinds of I/O line pairs, i.e., those for reading data bus RDB and writing data bus WDB are provided. The other features are basically the same as those of the configuration shown in FIG. 22, therefore the same portions are denoted with the same reference characters and the description is not repeated.

Figure 25:
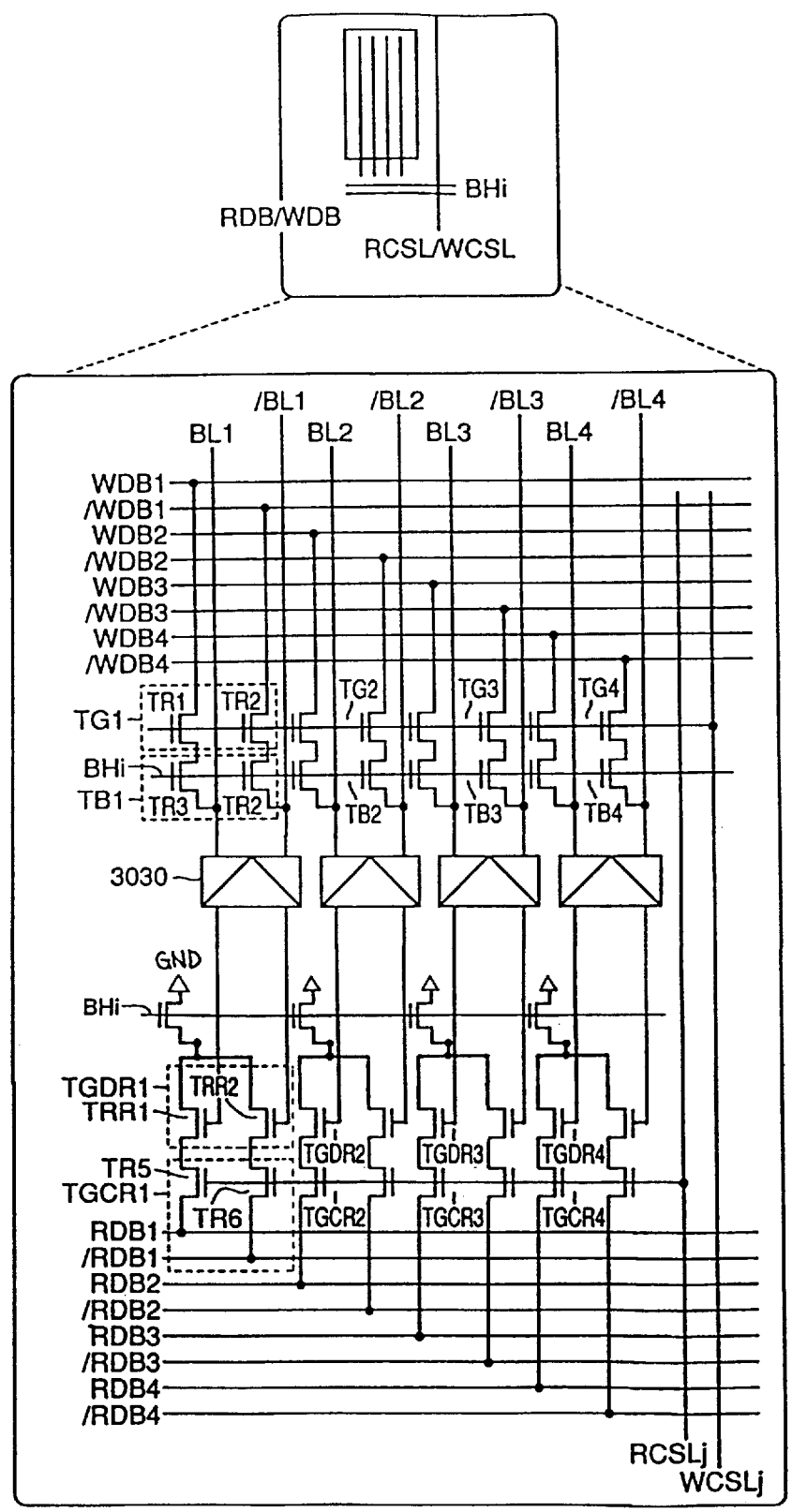
FIG. 25 is a diagram illustrating how data is transmitted from a bit line pair in a single memory cell block in the configuration shown in FIG. 24.

FIG. 25 is a circuit diagram showing how data is transmitted from four bit line pairs BL1, /BL1 to BL4, /BL4 included in one memory cell block MBij (i: 1 to N, j: 1 to m) to I/O line pairs I/O1, /I/O1 to I/O4, I/O4 in memory cell array 3200 shown in FIG. 24.

First transfer gates TG1 to TG4 are provided between bit line pairs BL1, /BL1 to BL4, /BL4 and corresponding writing data buses WDB1, /WDB1 to WDB4, /WDB4, respectively. First transfer gates TG1 to TG4 each include N-channel MOS transistors TR1 and TR2 provided between a corresponding bit line pair and a corresponding I/O bus and having their gate potentials controlled by a writing column selecting line WCSLj (j: natural number).

Second transfer gates TB1 to TB4 are provided between transfer gates TG1 to TG4 and corresponding bit line pairs BL1, /BL1 to BL4, /BL4, respectively. Second transfer gates TB1 to TB4 each include N-channel MOS transistors TR3 and TR4 provided between a corresponding bit line pair and a corresponding one of the first transfer gates and having their potentials controlled by a bank selecting line BHi.

Third transfer gates TGCR1 to TGCR4 between bit line pairs BL1, /BL1 to BL4, /BL4 and corresponding reading I/O buses RDB1, /RDB1 to RDB4, /RDB4, respectively. Third transfer gates TGCR1 to TGCR4 each include N-channel MOS transistors TR5 and TR6 provided between a corresponding bit line pair and a corresponding one of the first transfer gates and having their gate potentials controlled by a reading column selecting line RCSLj.

Direct sense type gates TGDR1 to TGDR4 are provided between third transfer gates TGCR1 to TGCR4 and corresponding bit line pairs BL1, /BL1 to BL4, /BL4, respectively. Direct sense type gates TGDR1 to TGDR4 each include N-channel MOS transistors TRR1 and TRR2 provided between a corresponding bit line pair and a corresponding I/O bus as shown in FIG. 25. The gate potential of transistor TRR1 is controlled by bit line BL and the gate potential of transistor TRR2 is controlled by bit line /BL1.

More specifically, in the configuration shown in FIG. 25, reading column selecting line RCSLj is shared by a plurality of banks. The direct sense type gate can transmit reading data to a reading data bus with no or only a small accessing loss if transistors TRR1 and TRR2 and transistors TR5 and TR6 controlled by reading column selecting signal line RCSLj.

More specifically, the direct sense type gate transmits a potential difference generated at a bit line pair to a reading data bus as a current difference by transistors TRR1 and TRR2 at the time of reading data. The current difference transmitted by the reading data bus is directly detected at a high speed as the current difference or detected after re-converted into a voltage difference. At this time, since the bit line pair and the reading data bus are isolated through the gates of transistors TRR1 and TRR2, the activation timing of reading column selecting line RCSLj may be the same as or earlier than that of the activation timing of a word line. Thus, the time required for accessing operation at the time of reading is reduced.

Meanwhile, in writing, data is written into a memory cell block whose writing column selecting line WCSLj and bank selecting line are both activated.

Thus, the bank arrangement divided in the lengthwise direction of the column selecting lines can be implemented.

Horizontally Divided Bank Arrangement 2

An arrangement which can generate a product signal of a bank selecting signal and a column selecting signal and implement a bank divided in the lengthwise direction of column selecting lines in a simpler manner than that shown in FIG. 24 and 25 will be now described.

Figure 26:
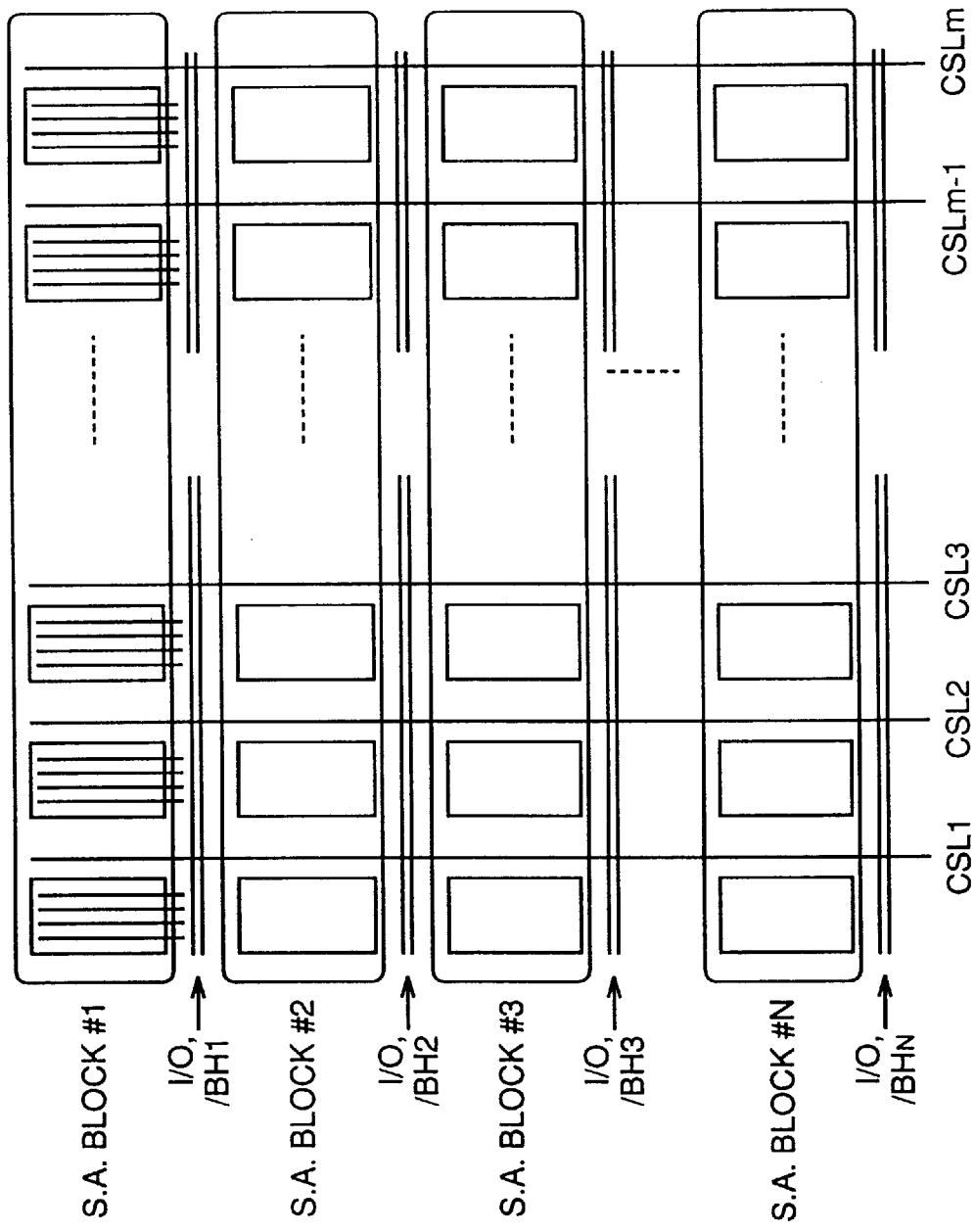
FIG. 26 is a schematic block diagram of a memory cell array 3400.

FIG. 26 is a schematic block diagram of a memory cell array 3400 having such an arrangement. Since the arrangement of the memory cell array is the same as that of memory cell array 3000 shown in FIG. 22 except that the bank selecting signal is signal /BHi, the inverse of signal BHi (in an "L" level active state), and therefore, the description is not repeated.

Figure 27:
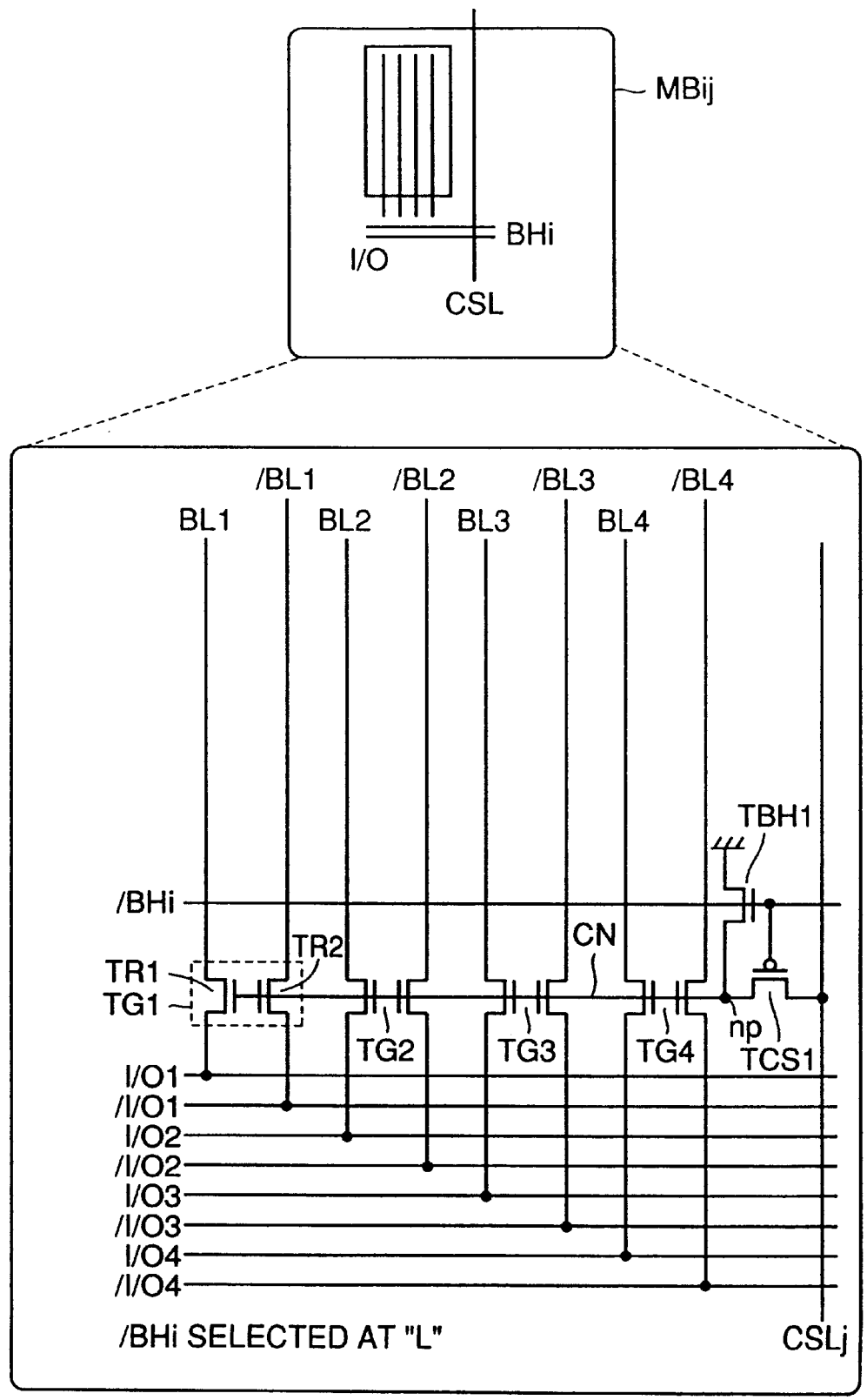
FIG. 27 is a diagram illustrating how data is transmitted to an I/O line pair from a bit line pair in a single memory cell block in the configuration shown in FIG. 26.

FIG. 27 is a circuit diagram showing how data is transmitted from four bit line pairs BL1, /BL1 to BL4, /BL4 included in a single memory cell block MBij (i: 1 to N, j: 1 to m) to I/O line pairs I/O1, /I/O1 to I/O4, /I/O4.

Transistor TBH1 is an N-channel MOS transistor having its source coupled with a ground potential and receives bank selecting signal /BHi at its gate. Transistor TCS1 is a P-channel MOS transistor connected between the drain of transistor TBH1 and column selecting line CSLj, and receives bank selecting signal /BHi at its gate. Hereinafter, the connection node of the drain of transistor TBH1 and transistor TCS1 will be referred to as a node np.

Transfer gates TG1 to TG4 are provided between bit line pairs BL1, /BL1 to BL4, /BL4 and I/O line pairs I/O1, /I/O1 to I/O4, I/O4, respectively. Transfer gates TG1 to TG4 each include N-channel MOS transistors TR1 and TR2 each provided between a corresponding bit line pair and a corresponding I/O line pair.

More specifically, when bank selecting signal /BHi is in an active state "L" level), transistor TBH1 is disconnected, transfer TCS1 conducts, and the potential level of column selecting line CSLj is transmitted to the gates of transistors TR1 and TR2 in transfer gates TG1 to TG4.

Meanwhile, when bank selecting signal /BHi is in an inactive state ("H" level), transistor TBH1 conducts, and transfer TCS1 is disconnected, and the ground potential is transmitted to transistors TR1 and TR2 in transfer gates TG1 to TG4. Thus, transfer gates TG1 to TG4 are disconnected.

In this configuration, the horizontally divided bank is implemented in a simple structure, so that the chip area can be reduced and the operation speed can be improved.

Horizontally Divided Bank Arrangement 3

Figure 28:
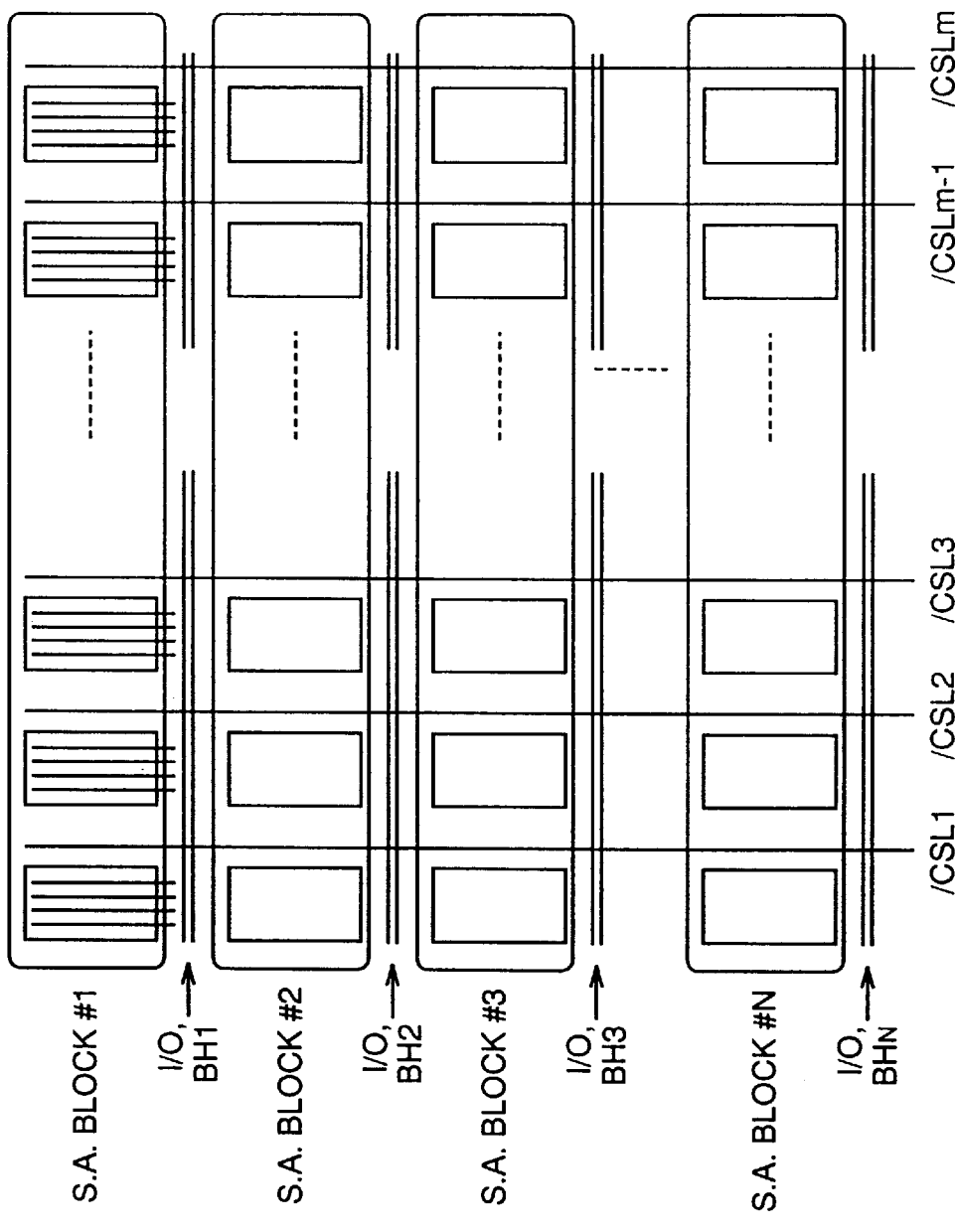
FIG. 28 is a schematic block diagram of a memory cell array 3600.

FIG. 28 is a schematic block diagram of a memory cell array 3600 according to a modification of the configuration shown in FIG. 26. Since the memory cell arrangement is the same as that of memory cell array 3000 shown in FIG. 22, except that the column selecting signal is the inverse signal /CSLj ("L" level, active) of signal CSLj, the description is not repeated.

Figure 29:
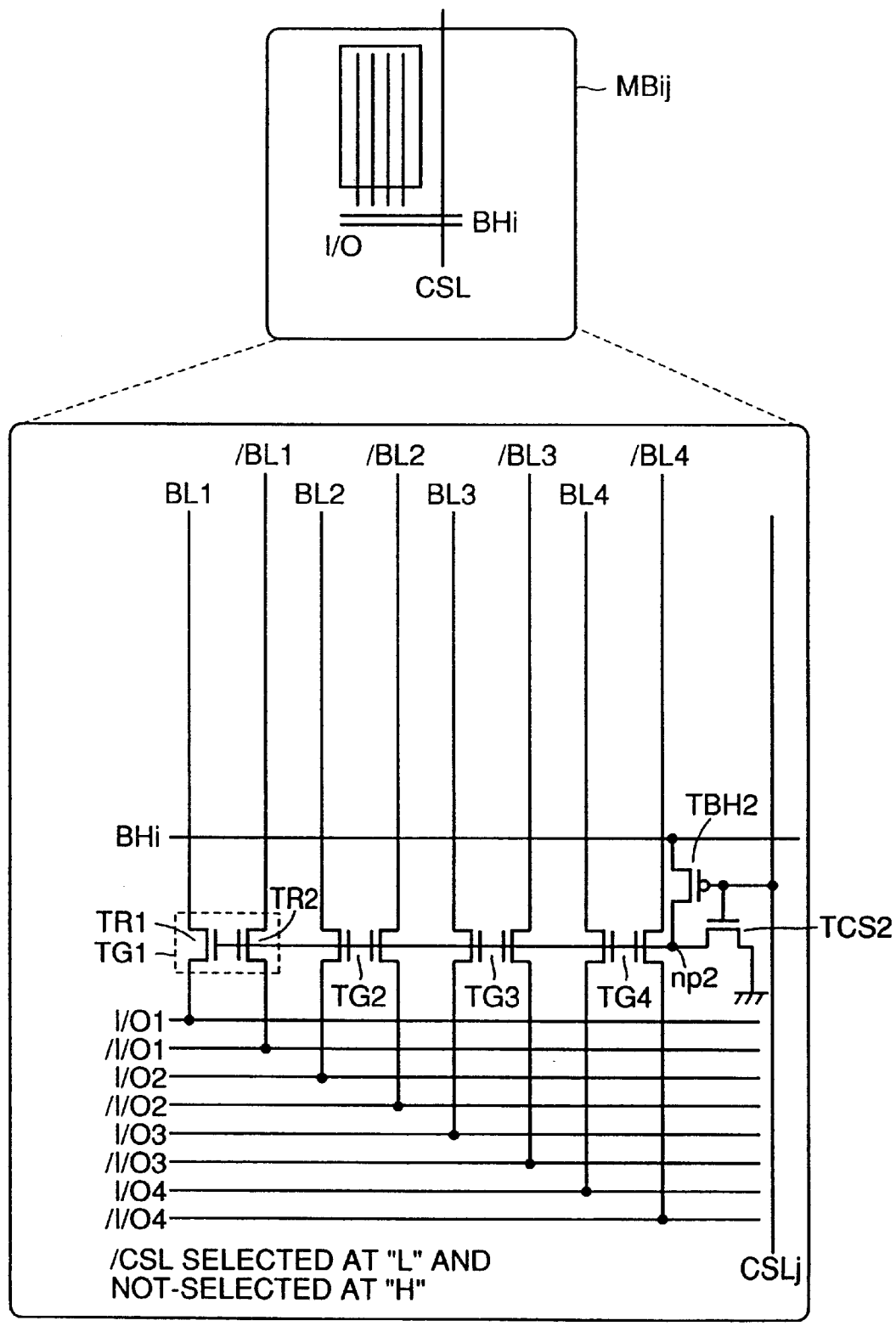
FIG. 29 is a diagram illustrating how data is transmitted to an I/O line pair from a bit line pair in a single memory cell block in the configuration shown in FIG. 28.
Figure 30:
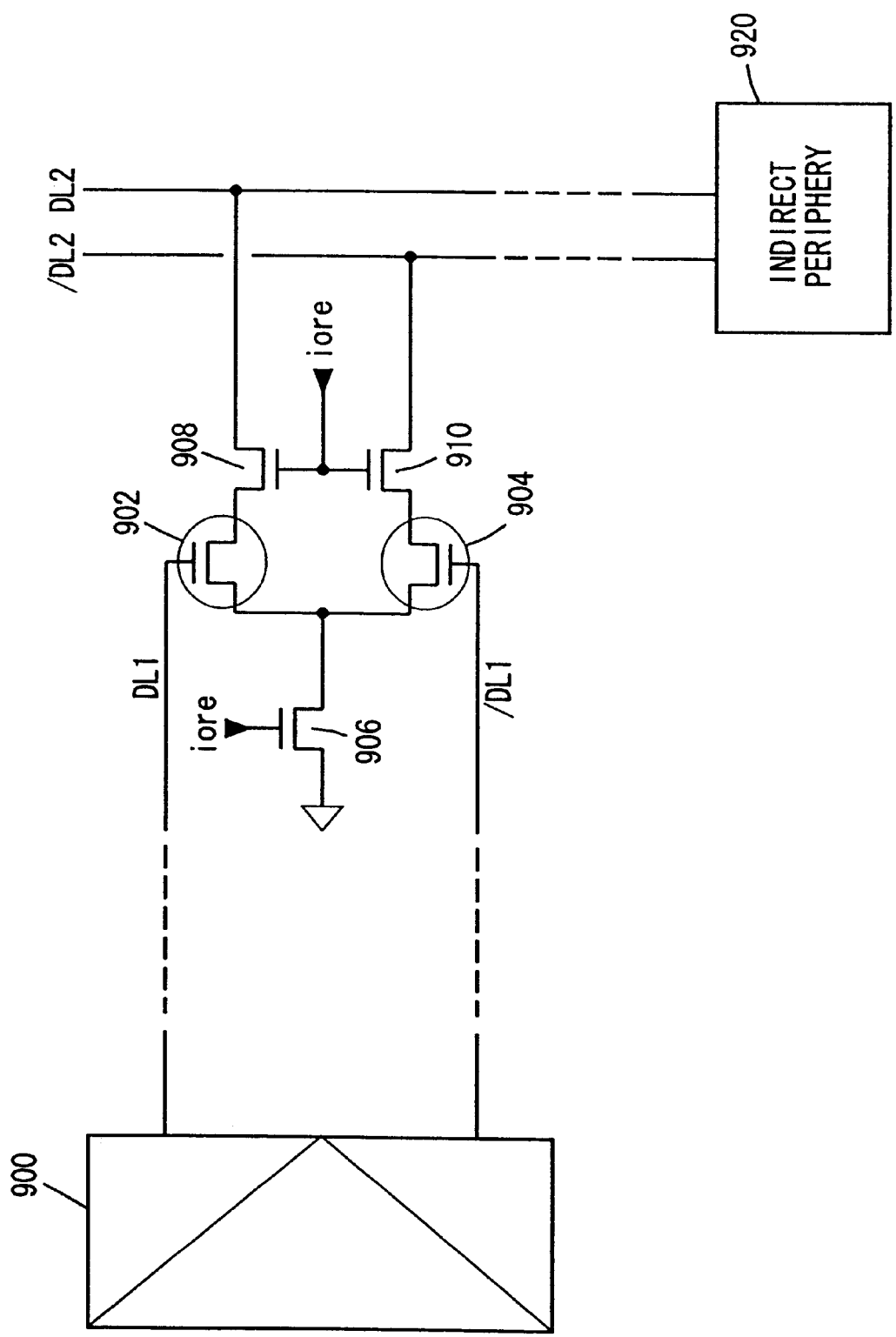
FIG. 30 is a schematic block diagram of a configuration according to the direct sense scheme.

FIG. 29 is a circuit diagram showing how data is transmitted from four bit line pairs BL1, /BL1 to BL4, /BL4 included in a single memory cell block MBij (i: 1 to N, j: 1 to m) in this configuration to I/O line pairs I/O1, /I/O 1to I/O4, /I/O4.

Transistor TCS2 is an N-channel MOS transistor having a source coupled with a ground potential and receives column selecting signal /CSLj at its gate. Transistor TBH2 is a P-channel MOS transistor coupled between the drain of transistor TCS2 and bank selecting signal BHi to receive column selecting signal /CSLj at its gate. Hereinafter, the connection node of the drain of transistor TCS2 and transistor TBH2 will be referred to as a node np2.

Transfer gates TG1 to TG4 are provided between bit line pairs BL1, /BL1 to BL4, /BL4 and corresponding I/O line pairs I/O line pairs I/O1, /I/O1 to I/O4, /I/O4, respectively. Transfer gates TG1 to TG4 each include N-channel MOS transistors TR1 and TR2 provided between a corresponding bit line pair and a corresponding I/O line pair and having a gate potential controlled by the potential of node np 2.

More specifically, when column selecting signal /CSL is in an active state ("L" level), transistor TCS2 is disconnected, transistor TBH2 conducts, and the potential level of bank selecting signal BHi is transmitted to the gates of transistors TR1 and TR2 in transfer gates TG1 to TG4.

Meanwhile, when column selecting signal /CSLj is in an inactive state ("H" level), transistor TCS2 conducts, transistor TBH2 is disconnected, and the ground potential is transmitted to the gates of transistors TR1 and TR2 in transfer gates TG1 to TG4. Thus, transfer gates TG1 to TG4 are disconnected.

Thus, the horizontally divided bank arrangement can be implemented by a simple configuration, the chip area can be reduced and the operation speed can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a first plurality of banks provided in the column-direction, each said bank including a second plurality of memory cell blocks provided in the row-direction, each said memory cell block having a plurality of memory cells arranged in a matrix of rows and columns and bit line pairs provided corresponding to the memory cell columns;

a row selecting circuit responsive to an address signal for selecting a corresponding bank and a corresponding memory cell row;

a column selecting circuit responsive to said address signal for generating a column selecting signal to select a corresponding memory cell column;

a plurality of first column selecting lines provided in common to said first plurality of banks in the column-direction for transmitting said column selecting signal;

a plurality of first input/output line pairs provided corresponding to said first plurality of banks in the row-direction; and a first selecting circuit for transmitting data read out from a memory cell column selected in response to said column selecting signal to said first input/output line pair, each said first selecting circuit including,
 a plurality of first gate circuits provided corresponding to memory cell columns in said memory cell block and controlled by a corresponding one of said first column selecting lines,
 each said first gate circuit including,
  a first transfer gate circuit provided on a transmission path between a bit line pair for a corresponding memory cell and one of said first input/output line pairs and controlled by said corresponding first column selecting line to switch between conductive and disconnected states, and
  a direct sense type gate circuit provided in series with the first transfer gate circuit on said transmission path.

2. The semiconductor memory device according to claim 1, wherein
said row selecting circuit generates a bank selecting signal to select a corresponding bank in response to an address signal,
said semiconductor memory device further comprising:
 a plurality of bank selecting lines provided in the row-direction for each of said banks for transmitting said bank selecting signal;
 a plurality of second column selecting lines provided in the column-direction in common to said first plurality of banks for transmitting said column selecting signal;
 a plurality of second input/output line pairs provided in the row-direction corresponding said first plurality of banks; and
 a plurality of second selecting circuits for transmitting data to be written into a memory cell column selected in response to said column selecting signal from said second input/output line pair,
each said second selecting circuit including a plurality of second gate circuits provided corresponding to memory cell columns in said memory cell block and controlled by a corresponding one of said second column selecting lines,
each said second gate circuit including,
 a second transfer gate circuit provided on a transmission path between a bit line pair for a corresponding memory cell column and one of said second input/output line pairs and controlled by said corresponding second column selecting line to attain a conductive or disconnected state, and
 a third transfer gate circuit provided in series with the second transfer gate circuit on said transmission path and controlled by said bank selecting line to attain a conductive or disconnected state.

3. A semiconductor memory device, comprising:
a first plurality of banks provided in the column-direction,
each said bank including a second plurality of memory cell blocks provided in the row-direction,
each said memory cell block including a plurality of memory cells arranged in a matrix of rows and columns and bit line pairs provided corresponding memory cell columns;
a row selecting circuit responsive to an address signal for generating a bank selecting signal to select a corresponding bank and selecting a memory cell row;
a plurality of bank selecting lines provided in the row-direction for each of said banks for transmitting said bank selecting signal;
a column selecting circuit responsive to said address signal for generating a column selecting signal to select a corresponding memory cell column;
a plurality of column selecting lines provided in common to said first plurality of banks in the column-direction for transmitting said column selecting signal;
a plurality of input/output line pairs provided in the row-direction corresponding to said first plurality of banks; and
a selecting circuit for transmitting data read out from a memory cell column selected in response to said column selecting signal to said input/output line pair,
each said selecting circuit including a plurality of gate circuits provided corresponding to said memory cell blocks and each controlled by a corresponding one of said column selecting lines,
each said gate circuit including,
 a product signal generating circuit responsive to said activation of a corresponding column selecting line and a corresponding bank selecting signal for generating an active driving signal; and
 a transfer gate circuit provided on a transmission path between a bit line pair for a corresponding memory cell column and one of said input/output line pairs and controlled by said driving signal to attain a conductive or disconnected state.

4. The semiconductor memory device according to claim 3, wherein
said product signal generating circuit includes,
 an internal node for supplying said driving signal;
 a first P-channel MOS transistor provided between said internal node and said corresponding bank selecting line and having a gate potential controlled by said column selecting line; and
 a second N-channel MOS transistor provided between a ground potential and said internal node and having a gate potential controlled by said bank selecting line.

5. The semiconductor memory device according to claim 3, wherein
said product signal generating circuit includes,
 an internal node for supplying said driving signal;
 a second P-channel MOS transistor provided between said internal node and said corresponding bank selecting line and having a gate potential controlled by said column selecting line; and
 a second N-channel MOS transistor provided between a ground potential and said internal node and having a gate potential controlled by said column selecting line.

* * * * *